(12) United States Patent
Tsutsui

(10) Patent No.: US 9,818,473 B2
(45) Date of Patent: Nov. 14, 2017

(54) SEMICONDUCTOR DEVICE INCLUDING STACKED CIRCUITS

(71) Applicant: Semiconductor Energy Laboratory Co., Ltd., Kanagawa-ken (JP)

(72) Inventor: Naoaki Tsutsui, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/656,082

(22) Filed: Mar. 12, 2015

(65) Prior Publication Data

US 2015/0325285 A1  Nov. 12, 2015

(30) Foreign Application Priority Data

Mar. 14, 2014  (JP) ................... 2014-051215

(51) Int. Cl.
*G11C 11/41*  (2006.01)
*H01L 27/12*  (2006.01)
(Continued)

(52) U.S. Cl.
CPC .............. *G11C 11/41* (2013.01); *G11C 5/025* (2013.01); *G11C 11/417* (2013.01);
(Continued)

(58) Field of Classification Search
CPC ..... G11C 11/412; G11C 11/417; G11C 11/41; G11C 5/025; H01L 27/1207
(Continued)

(56) References Cited

U.S. PATENT DOCUMENTS 5,731,856 A   3/1998  Kim et al.
5,731,945 A * 3/1998  Bertin ................. H01L 23/5286
                                                         257/E23.153
(Continued)

FOREIGN PATENT DOCUMENTS

EP   1737044 A   12/2006
EP   2226847 A    9/2010
(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — J. H. Hur
(74) *Attorney, Agent, or Firm* — Husch Blackwell LLP

(57) ABSTRACT

This invention provides a semiconductor device with high speed operation and reduced size. A circuit includes a circuit including a memory circuit and a circuit including a logic circuit; thus, the circuit functions as a memory device having a function of storing data and a function of performing logic operation. The circuit can output, in addition to data stored in the circuit, data corresponding to a result of logic operation performed using data stored in the circuit as an input signal. The circuit can directly obtain a result of logic operation from the circuit, and thus, the frequency of input/output of a signal performed between the circuit and the circuit can be reduced.

7 Claims, 18 Drawing Sheets

(51) Int. Cl.
*H01L 29/78* (2006.01)
*H01L 27/11* (2006.01)
*G11C 5/02* (2006.01)
*H01L 21/82* (2006.01)
*H01L 27/10* (2006.01)
*H01L 27/08* (2006.01)
*H01L 27/06* (2006.01)
*G11C 11/417* (2006.01)
*H01L 29/786* (2006.01)
*H01L 27/088* (2006.01)
*H01L 27/108* (2006.01)
*H01L 27/11526* (2017.01)
*H01L 21/8258* (2006.01)
*H01L 27/1156* (2017.01)
*G11C 11/412* (2006.01)

(52) U.S. Cl.
CPC ...... *H01L 21/8258* (2013.01); *H01L 27/0688* (2013.01); *H01L 27/088* (2013.01); *H01L 27/10897* (2013.01); *H01L 27/1108* (2013.01); *H01L 27/11526* (2013.01); *H01L 27/1207* (2013.01); *H01L 29/786* (2013.01); *H01L 29/7869* (2013.01); *G11C 11/412* (2013.01); *H01L 27/1156* (2013.01)

(58) Field of Classification Search
CPC ............. H01L 29/7869; H01L 27/1108; H01L 21/8258; H01L 27/088; H01L 27/11526; H01L 27/10897; H01L 27/0688; H01L 29/786; H01L 27/1156
See application file for complete search history.

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,377,504 B1* | 4/2002 | Hilbert | G11C 5/025 365/189.02 |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,472,227 B2 | 6/2013 | Liaw | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0227764 A1 | 11/2004 | Endo | |
| 2005/0017302 A1 | 1/2005 | Hoffman | |
| 2005/0138507 A1 | 6/2005 | Kurokawa | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0089417 A1 | 4/2011 | Yamazaki et al. | |
| 2011/0090184 A1* | 4/2011 | Yamazaki | G09G 3/20 345/204 |
| 2011/0101351 A1 | 5/2011 | Yamazaki | |
| 2012/0146207 A1* | 6/2012 | Chou | H01L 23/3675 257/690 |
| 2014/0250279 A1* | 9/2014 | Manning | G06F 12/00 711/154 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |

(56) References Cited

FOREIGN PATENT DOCUMENTS

| JP | 63-239117 A | 10/1988 |
|---|---|---|
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-155264 A | 8/2011 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "BluePhase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3-A2O3-BO Systems [A; Fe, Ga, or Al; B; Mg, Mn, Fe, Ni, Cu, or Zn] at Temperatures Over 1000° C", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

(56) References Cited

OTHER PUBLICATIONS

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$—$Ga_2ZnO_4$—ZnO system at 1350° C", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21,3:4.0 In. QVGA AMOLED Display Using In-Ga-Zn-Oxide TFTs With a Novel Passivation Layer", SID Digest '09 : SID International Symposium Digest of Technical Papers, May 31, 2009, pp. 284-287.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emision AMOLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In-Ga-Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

FIG. 15A
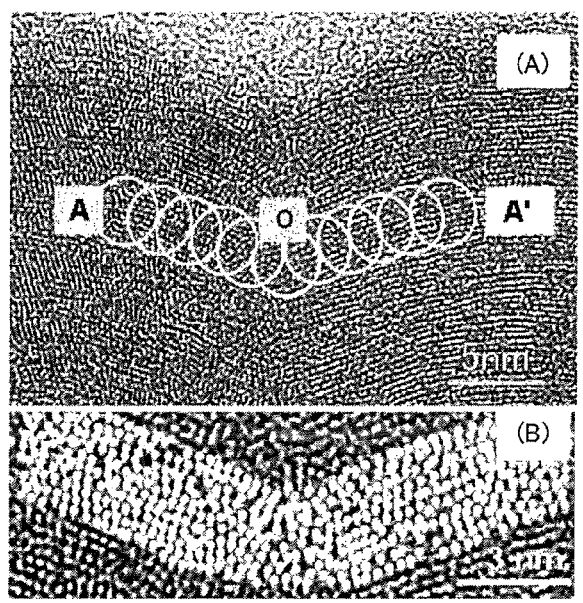
FIG. 15B
FIG. 15C
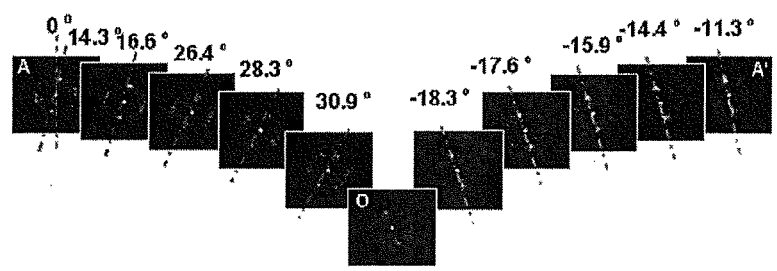

CAAC-OS nc-OS

- 2010
- 2012
- 2014
- 2016
- 2018
- 2020
- 2022

- 2024
- 2012
- 2028
- 2016
- 2032

☐ proportion of non-CAAC    ☰ proportion of CAAC as-sputtered after heat treatment at 450°C

SEMICONDUCTOR DEVICE INCLUDING STACKED CIRCUITS

BACKGROUND OF THE INVENTION

1. Field of the Invention

One embodiment of the present invention relates to a semiconductor device having functions of storing data and performing logic operation.

Note that one embodiment of the present invention is not limited to the above technical field. The technical field of one embodiment of the invention disclosed in this specification and the like relates to an object, a method, or a manufacturing method. Another embodiment of the present invention relates to a process, a machine, manufacture, or a composition (composition of matter). Another embodiment of the present invention relates to a semiconductor device, a display device, a light-emitting device, a power storage device, a memory device, or a driving method thereof, or a manufacturing method thereof.

2. Description of the Related Art

Data processing in a computer is performed by a central processing unit (CPU) including a control device and an arithmetic device. The central processing unit performs processing of a program stored in a memory, control of input/output of data, logic operation of data stored in a memory, and the like.

Logic operation is performed by processing in which data stored in a memory is read and input to a central processing unit, processing in which logic operation is performed with a logic circuit included in the central processing unit, and processing in which a result of the logic operation is written to the memory. As described above, in general, a logic circuit is provided inside a central processing unit and logic operation is performed in the central processing unit.

Furthermore, a structure of an integrated circuit including a logic circuit connected to a memory array is disclosed in Patent Document 1.

PRIOR ART DOCUMENTS

Patent Documents

[Patent Document 1] Japanese Published Patent Application No. 2011-155264

SUMMARY OF THE INVENTION

In the case where logic operation is performed, in addition to operation in which arithmetic operation is performed in the central processing unit, operation in which desired data is read from the memory and operation in which a result of arithmetic operation is written to the memory are necessary. Therefore, a period required for logic operation is increased and processing time in a computer is increased.

Furthermore, in an integrated circuit described in Patent Document 1, a memory array and a logic circuit are formed over the same substrate; therefore, when a logic circuit is provided, the area of the integrated circuit is increased. In addition, the operation speed of the computer is decreased and power consumption is increased.

In view of the technical background, an object of one embodiment of the present invention is to provide a novel semiconductor device.

Another object of one embodiment of the present invention is to provide a semiconductor device capable of operating at high speed. Another object of one embodiment of the present invention is to provide a semiconductor device capable of reducing its size.

Note that one embodiment of the present invention does not necessarily achieve all the objects listed above and only needs to achieve at least one of the objects. Furthermore, the description of the above objects does not disturb the existence of other objects. Other objects are apparent from the description of the specification, the drawings, the claims, and the like, and the other objects can be derived from the description of the specification, the drawings, the claims, and the like.

A semiconductor device of one embodiment of the present invention includes a cell array, the cell array includes a first circuit and a second circuit provided over the first circuit with an insulating layer provided therebetween, the first circuit includes a memory circuit, the second circuit includes a logic circuit, the logic circuit is electrically connected to the memory circuit, the logic circuit has a function of performing logic operation using data stored in the memory circuit as an input signal, and the second circuit includes a region overlapping with the first circuit.

In addition, the semiconductor device of one embodiment of the present invention may have a function of outputting data stored in the memory circuit and a result of the logic operation to the central processing unit.

In addition, in the semiconductor device of one embodiment of the present invention, the memory circuit may include a first transistor, the logic circuit may include a second transistor, the first transistor may include a single crystal semiconductor in a channel formation region, and the second transistor may include an oxide semiconductor in a channel formation region.

In addition, in the semiconductor device of one embodiment of the present invention, one of a source and a drain of the first transistor may be electrically connected to a gate of the second transistor.

In addition, in the semiconductor device of one embodiment of the present invention, the memory circuit may include an SRAM cell and the logic circuit may include an AND circuit, an OR circuit, a NAND circuit, a NOR circuit, or a circuit of combination of any of them.

According to one embodiment of the present invention, a novel semiconductor device can be provided. Alternatively, according to one embodiment of the present invention, a semiconductor device capable of operating at high speed can be provided. Alternatively, according to one embodiment of the present invention, a semiconductor device capable of reducing its size can be provided.

Note that the description of these effects does not disturb the existence of other effects. Note that one embodiment of the present invention does not necessarily achieve all the objects listed above. Note that other effects will be apparent from the description of the specification, the drawings, the claims, and the like, and the other effects can be derived from the description of the specification, the drawings, the claims, and the like.

BRIEF DESCRIPTION OF THE DRAWINGS

FIGS. 15A-15C show diagrams illustrating an example of a structure of an oxide semiconductor.

DETAILED DESCRIPTION OF THE INVENTION

Embodiments of the present invention will be described below in detail with reference to the drawings. Note that the present invention is not limited to description in the following embodiments and it is easily understood by those skilled in the art that the mode and details can be variously changed without departing from the scope and spirit of the present invention. Therefore, the present invention should not be interpreted as being limited to the description in the following embodiments.

Furthermore, one embodiment of the present invention includes, in its category, an RF (Radio Frequency) tag, a semiconductor display device, an integrated circuit, and any other devices. Furthermore, the display device includes, in its category, a display device in which an integrated circuit is included in a circuit, such as a liquid crystal display device, a light-emitting device in which a light-emitting element typified by an organic light-emitting element is provided in each pixel, an electronic paper, a DMD (Digital Micromirror Device), a PDP (Plasma Display Panel), an FED (Field Emission Display), and the like.

Embodiment 1

In this embodiment, a structure example of one embodiment of the present invention is described.

Figure 1A:
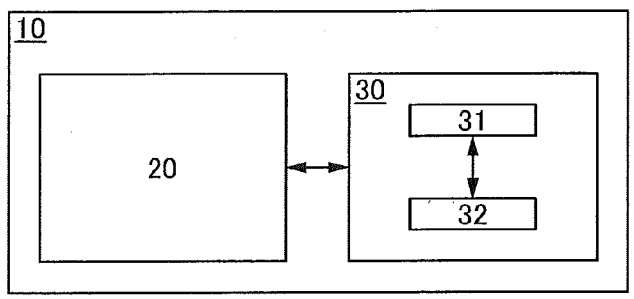
FIGS. 1A-1C show diagrams illustrating an example of a structure of a semiconductor device.

FIG. 1(A) illustrates a structure example of a semiconductor device 10 of one embodiment of the present invention. The semiconductor device 10 includes a circuit 20 and a circuit 30.

The circuit 20 is a circuit having functions of performing data processing, controlling other circuits, and the like. The circuit 20 can be constituted with an integrated circuit which includes a plurality of transistors. Furthermore, the circuit 20 can include a variety of logic circuits such as a sequential circuit and a combinational circuit. The circuit 20 can be used as a central processing unit.

The circuit 30 has a function of storing data input from the circuit 20, an input/output device (not shown), and the like. Furthermore, the circuit 30 has a function of outputting the data stored in the circuit 30 to the circuit 20, the input/output device, and the like. The circuit 30 can be used as a memory device such as a cache memory, a main memory device, or an auxiliary memory device.

In addition, the circuit 30 includes a circuit 31 and a circuit 32. The circuit 31 includes a circuit having a function of storing data (hereinafter, referred to as a memory circuit). The circuit 31 can include a cell array including a plurality of memory circuits. The circuit 31 can be constituted with a volatile memory such as a DRAM or an SRAM, or a nonvolatile memory such as a NAND flash memory. Furthermore, the circuit 31 may include a driver circuit for controlling the operation of the above cell array.

The circuit 32 includes a circuit having a function of performing logic operation (hereinafter, referred to as a logic circuit). The circuit 32 is connected to the circuit 31. The logic circuit can include a NOT circuit, an AND circuit, an OR circuit, a NOR circuit, a NAND circuit, an XOR circuit, or the like; however, there is no particular limitation. The circuit 32 has a function of performing logic operation using data stored in the circuit 31 as an input signal and outputting a result of the logic operation to the circuit 31. The result of the operation performed by the circuit 32 can be output to the circuit 20.

In general, in the case where logic operation is performed in the semiconductor device 10, data stored from the circuit 20 to the circuit 30 is accessed first. Next, in the circuit 30, data stored in the circuit 31 is read and the data is output to the circuit 20. Next, in the circuit 20, logic operation using the data input from the circuit 30 as an input signal is performed. Then, the result obtained by the logic operation is output to the circuit 30 and stored in the circuit 31.

According to one embodiment of the present invention, the circuit 30 includes the circuit 31 including the memory circuit and the circuit 32 including the logic circuit. Thus, the circuit 30 can function as a memory device having a function of storing data and a function of performing logic operation. In other words, the circuit 30 can output, in addition to data stored in the circuit 31, data corresponding to a result of logic operation using data stored in the circuit 31 as an input signal. Consequently, the circuit 20 can directly obtain a result of logic operation from the circuit 30. Therefore, the frequency of input/output of a signal performed between the circuit 20 and the circuit 30 can be reduced.

Furthermore, without logic operation performed in the circuit 20, a result of logic operation using data stored in the circuit 31 as an input signal can be obtained. Consequently, the time for data processing in the circuit 20 can be shortened. Thus, the operation speed of the semiconductor device 10 can be increased.

Figure 1B:
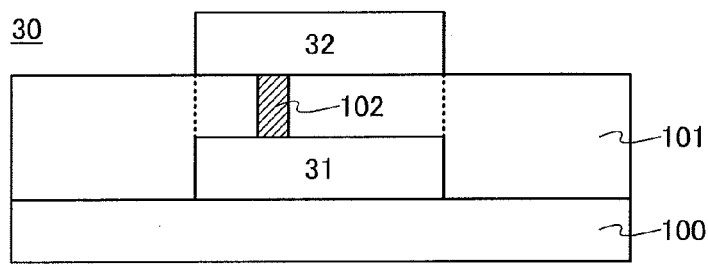

FIG. 1(B) illustrates an example of a cross-sectional structure of the circuit 30. The circuit 30 includes the circuit 31 over a substrate 100, an insulating layer 101 over the circuit 31, and the circuit 32 over the insulating layer 101. The insulating layer 101 has an opening and a conductive layer 102 is provided in the opening. The circuit 32 is connected to the circuit 31 through the conductive layer 102.

Here, the circuit 32 preferably includes a region overlapping with the circuit 31. Furthermore, the entire region of the circuit 32 preferably overlaps with the circuit 31. Thus, an increase in area of the circuit 30 can be suppressed and a function of performing logic operation can be added to the circuit 30. Consequently, the size of the semiconductor device 10 can be tried to be decreased.

Note that part of the circuit 31 can be formed using part of the substrate 100. For example, the circuit 31 can include a transistor whose channel formation region is formed in part of the substrate 100. In this case, the substrate 100 is preferably a substrate including a single crystal semiconductor. As such a substrate 100, a single crystal silicon substrate, a single crystal germanium substrate, or the like can be used.

Furthermore, FIG. 1(B) illustrates a structure in which one conductive layer 102 is provided; however, the number of conductive layers 102 is not limited thereto. For example, a structure in which openings are provided in two portions in the insulating layer 101 and the conductive layer 102 is provided in each of these openings can be employed. In this case, a structure in which one of the conductive layers 102 is connected to an input terminal of the logic circuit included in the circuit 32, and the other of the conductive layers 102 is connected to an output terminal of the logic circuit included in the circuit 32 can be employed.

Figure 1C:
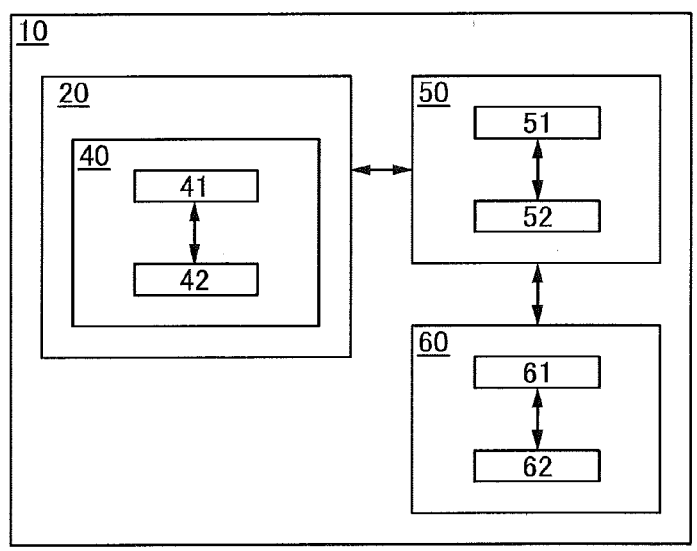

The structure of the circuit 30 which includes the circuit 31 including the memory circuit and the circuit 32 including the logic circuit can be applied to a variety of memory devices. As an example, FIG. 1(C) illustrates a structure in which the semiconductor device 10 includes a cache memory 40, a main memory device 50, and an auxiliary memory device 60.

The cache memory 40 has a function of storing a copy of part of data stored in the main memory device 50. The cache memory 40 can be provided inside the circuit 20.

The main memory device 50 has a function of storing data used for data processing in the circuit 20. The main memory device 50 has a function of storing data input from the circuit 20 or the input/output device and a function of outputting data stored in the main memory device 50 to the circuit 20 or the input/output device.

The auxiliary memory device 60 has a function of storing data used for processing in the circuit 20. The auxiliary memory device 60 has a function of storing data input from the main memory device 50 and a function of outputting the data stored in the auxiliary memory device 60 to the main memory device 50.

Here, the cache memory 40 includes a circuit 41 and a circuit 42. The main memory device 50 includes a circuit 51 and a circuit 52. The auxiliary memory device 60 includes a circuit 61 and a circuit 62.

The circuit 41, the circuit 51, and the circuit 61 are circuits including memory circuits. The circuit 41 and the circuit 51 can be constituted with a volatile memory such as a DRAM or an SRAM. The circuit 61 can be constituted with a nonvolatile memory such as a NAND flash memory. The circuit 41, the circuit 51, and the circuit 61 each can have a structure similar to that of the circuit 31.

The circuit 42, the circuit 52, and the circuit 62 each are a circuit including a logic circuit, like the circuit 32. The cache memory 40 has a function of performing logic operation by including the circuit 42. The main memory device 50 has a function of performing logic operation by including the circuit 52. The auxiliary memory device 60 has a function of performing logic operation by including the circuit 62. The circuit 42, the circuit 52, and the circuit 62 each can have a structure similar to that of the circuit 32.

The cache memory 40, the main memory device 50, and the auxiliary memory device 60 each have a function of performing logic operation as described above; thus, the time for data processing in the circuit 20 can be shortened. Consequently, the operation speed of the semiconductor device 10 can be improved.

Note that the cache memory 40, the main memory device 50, and the auxiliary memory device 60 can have a structure similar to that in FIG. 1(B). Furthermore, one or two of the cache memory 40, the main memory device 50, and the auxiliary memory device 60 may have a structure similar to that in FIG. 1(B).

Next, an example of the structure of the circuit 30 is described with reference to FIG. 2.

Figure 2A:
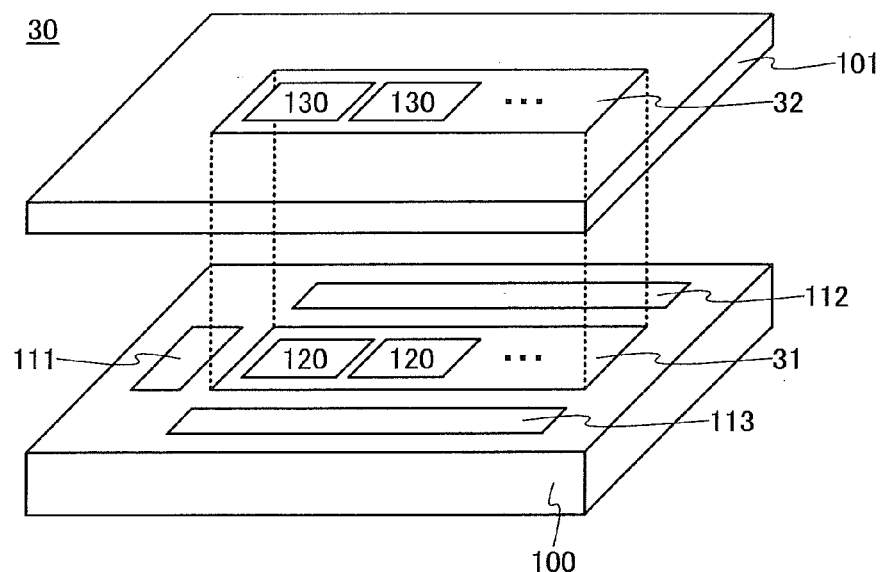
FIGS. 2A-2B show diagrams each illustrating an example of a structure of a semiconductor device.

FIG. 2(A) is a perspective view illustrating an example of the structure of the circuit 30 in FIGS. 1(A) and (B). The circuit 30 includes the circuit 31, a circuit 111, a circuit 112, and a circuit 113 over the substrate 100, the insulating layer 101 over the circuit 31, the circuit 111, the circuit 112, and the circuit 113, and the circuit 32 over the insulating layer 101. Note that although not illustrated here, the circuit 32 is connected to the circuit 31 through the conductive layer.

The circuit 31 includes a plurality of memory circuits 120. The memory circuit 120 can be constituted with a volatile memory such as a DRAM or an SRAM, or a nonvolatile memory such as a NAND flash memory.

The circuit 32 includes a plurality of logic circuits 130. Although not illustrated here, the logic circuit 130 is connected to the memory circuit 120. The logic circuit 130 has a function of performing logic operation using data stored in the memory circuit 120 as an input signal. The logic circuit 130 can include, for example, a NOT circuit, an AND circuit, an OR circuit, a NOR circuit, a NAND circuit, an XOR circuit, or the like.

Note that the circuit 32 may include one kind of the logic circuits 130 or may include two or more kinds of the logic circuits 130. Furthermore, another logic circuit such as an adder may be constituted with combination of one kind or two or more kinds of the logic circuits 130 included in the circuit 32. For example, a half adder can be constituted with combination of a NOT circuit, an AND circuit, and an OR circuit or with combination of an XOR circuit and an AND circuit. Furthermore, a full adder can be constituted with combination of a half adder and an OR circuit.

Here, the substrate 100 can be a substrate including a single crystal semiconductor. As this substrate, a single crystal silicon substrate, a single crystal germanium substrate, or the like can be used. Furthermore, the memory circuits 120 can be constituted with transistors whose channel formation regions are formed in part of the substrate 100. That is, the memory circuits 120 can be constituted with transistors including a single crystal semiconductor in its channel formation regions. The memory circuit is constituted with such a transistor; thus, the operation speed of the memory circuits 120 can be increased.

In contrast, the logic circuits 130 can be constituted with transistors whose channel formation regions are formed in a semiconductor film. For example, the logic circuits 130 can be constituted with transistors each including a non-single-crystal semiconductor in a channel formation region. As the non-single-crystal semiconductor, non-single-crystal silicon such as amorphous silicon, microcrystalline silicon, or polycrystalline silicon, non-single-crystal germanium such as amorphous germanium, microcrystalline germanium, or polycrystalline germanium, or the like can be used. Alternatively, the logic circuits 130 can be constituted with transistors each including an oxide semiconductor in its channel formation region (hereinafter also referred to as an OS transistor). Such a transistor whose channel formation region is formed in a semiconductor film can be formed over the insulating layer 101; thus, the logic circuits 130 can be formed over the insulating layer 101. Accordingly, as shown in FIG. 2(A), the insulating layer 101 can be provided over the memory circuits 120, and the logic circuits 130 can be provided over the insulating layer 101. That is, a structure in which the memory circuits 120 and the logic circuits 130 are stacked can be obtained.

Here, an oxide semiconductor has a wider band gap and lower intrinsic carrier density than silicon and the like. Thus, an off-state current of an OS transistor is extremely small. Accordingly, with a structure in which the logic circuits 130 include OS transistors, the logic circuits 130 with a small off-state leakage current and low power consumption can be formed.

Furthermore, the OS transistor can operate at high speed when miniaturized. Therefore, with the structure in which the logic circuits 130 include OS transistors, the operation speed of the logic circuits 130 can be increased. In this case, the operation speed of the logic circuit can be less than or equal to 10 ns, preferably less than or equal to 5 ns. The channel length of the OS transistor can be less than or equal to 100 nm, preferably less than or equal to 60 nm, further preferably less than or equal to 40 nm, even further preferably less than or equal to 30 nm.

The circuit 32 preferably includes a region overlapping with the circuit 31. Furthermore, the logic circuit 130 preferably includes a region overlapping with any of the plurality of memory circuits 120. Thus, an increase in area of the circuit 30 can be suppressed and a function of performing logic operation can be added to the circuit 30. Note that the logic circuits 130 also can be located so as to have regions overlapping with the circuit 111, the circuit 112, or the circuit 113.

Figure 2B:
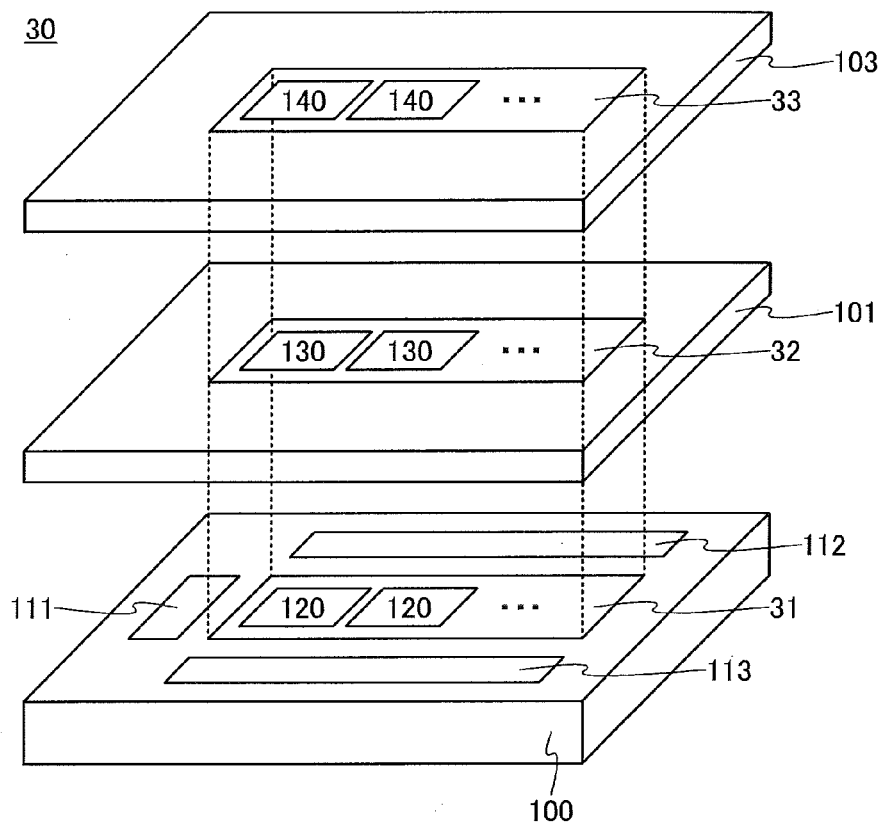

Note that FIG. 2(A) illustrates a structure in which one layer of the circuit 32 including the logic circuits 130 is provided over the circuit 31; however, there is no limitation thereto, a structure in which two or more layers of circuits including logic circuits are provided over the circuit 31 may be employed. FIG. 2(B) illustrates an example of the structure in which two layers of circuits including logic circuits are provided over the circuit 31.

The circuit 30 illustrated in FIG. 2(B) includes an insulating layer 103 over the circuit 32 and a circuit 33 over the insulating layer 103, in addition to the structure in FIG. 2(A).

The circuit 33 includes a plurality of logic circuits 140. The logic circuit 140 is connected to the memory circuit 120 or the logic circuit 130. The logic circuit 140 has a function of performing logic operation using one or both of data stored in the memory circuit 120 and an output signal of the logic circuit 130 as an input signal. The logic circuit 140 can include, for example, a NOT circuit, an AND circuit, an OR circuit, a NOR circuit, a NAND circuit, an XOR circuit, or the like.

Note that the circuit 33 may include one kind of the logic circuits 140 or may include two or more kinds of the logic circuits 140. Furthermore, another logic circuit such as an adder may be constituted with combination of one kind or two or more kinds of the logic circuits 140 included in the circuit 33. For example, a half adder can be constituted with combination of a NOT circuit, an AND circuit, and an OR circuit or with combination of an XOR circuit and an AND circuit. Furthermore, a full adder can be constituted with combination of a half adder and an OR circuit.

Furthermore, the logic circuit 140 can be a circuit capable of performing logic operation different from that of the logic circuit 130. Thus, the kinds of logic operations which can be performed in the circuit 30 can be increased. Furthermore, another logic circuit such as an adder may be constituted with combination of the logic circuit 130 and the logic circuit 140. For example, as described above, a half adder or a full adder can be formed.

The circuit 111 illustrated in FIG. 2(A) is a driver circuit having a function of supplying a signal for selecting a specific memory circuit 120 of the plurality of memory circuits 120 and a function of supplying a signal for selecting a specific logic circuit 130 of the plurality of logic circuits 130. The circuit 112 is a driver circuit having functions of writing data to the memory circuit 120, reading the data from the memory circuit 120, and reading data obtained by logic operation in the logic circuit 130. The circuit 113 is a driver circuit having a function of supplying (precharging) a predetermined potential to a wiring connected to the memory circuit 120. In the circuit 30 illustrated in FIG. 2(B), the circuit 111 further has a function of supplying a signal for selecting a specific logic circuit 140 of the plurality of logic circuits 140. Note that the circuit 112 can have a function of the circuit 113 and thus, the circuit 113 can be omitted.

Next, an example of a specific structure of the circuit 30 is described with reference to FIG. 3.

Figure 3:
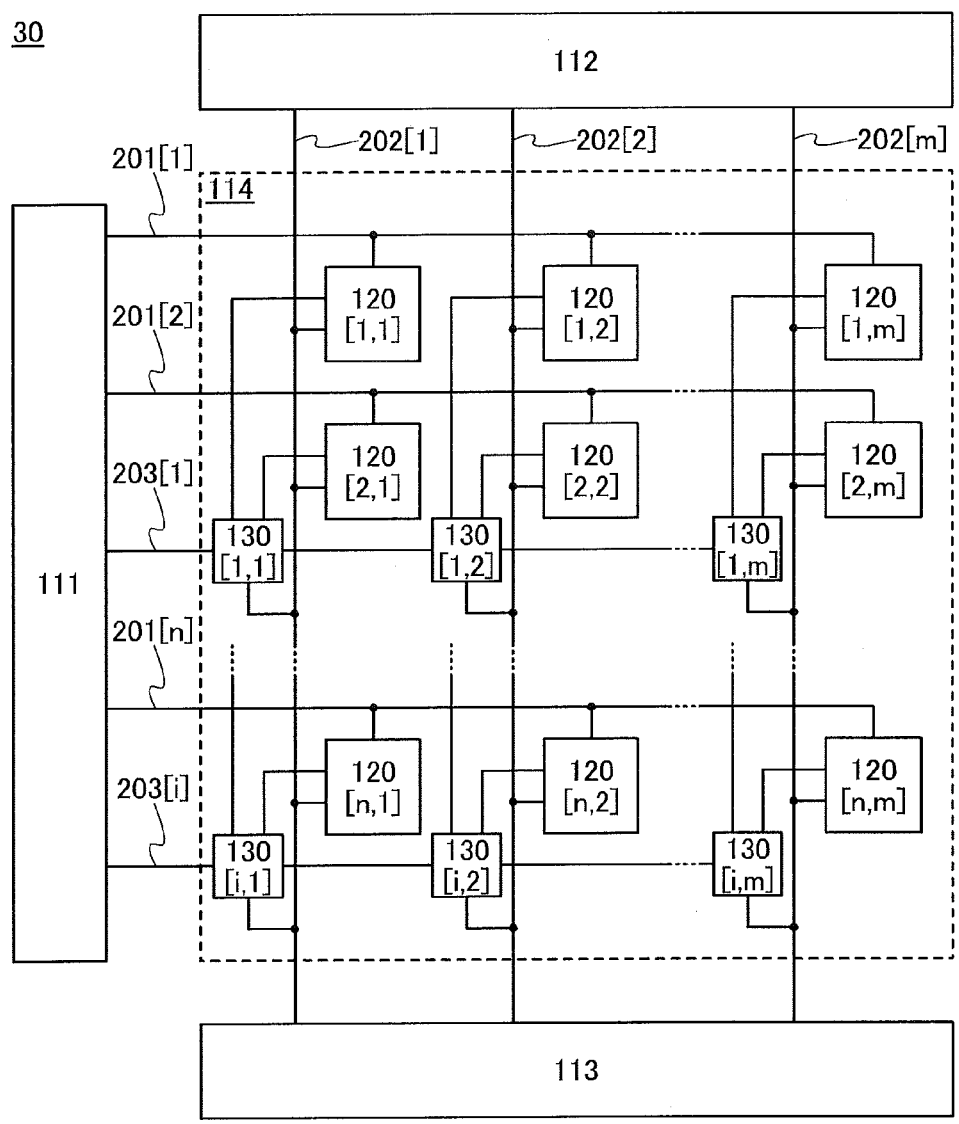
FIG. 3 shows a diagram illustrating an example of a structure of a semiconductor device.

FIG. 3 shows an example of the structure of the circuit 30. The circuit 30 includes the circuit 111, the circuit 112, the circuit 113, and a cell array 114. Furthermore, the cell array 114 includes a plurality of memory circuits 120 and a plurality of logic circuits 130. Here, an example where n rows and m columns (n and m are natural numbers) of memory circuits 120 and i rows and m columns (i is a natural number) of logic circuits 130 are provided in the cell array 114 is shown. That is, the cell array 114 includes n×m memory circuits 120 (memory circuits 120[1, 1] to [n, m]) and i×m logic circuits 130 (logic circuits 130[1, 1] to [i, m]). Note that the cell array 114 corresponds to a circuit including the circuit 31 and the circuit 32 in FIGS. 1 and 2.

The circuit 111 is connected to the memory circuits 120[1, 1] to [n, m] through a plurality of wirings 201 (wirings 201[1] to [n]) and connected to the logic circuits 130[1, 1] to [i, m] through a plurality of wirings 203 (wirings 203[1] to [i]). The circuit 111 is a driver circuit having a function of supplying a signal for selecting the memory circuits 120 in a specific row of the plurality of memory circuits 120 to the wiring 201 and a function of supplying a signal for selecting the logic circuits 130 in a specific row of the plurality of logic circuits 130 to the wiring 203.

The circuit 112 is connected to the memory circuits 120[1, 1] to [n, m] and the logic circuits 130[1, 1] to [i, m] through a plurality of wirings 202 (wirings 202[1] to [m]). The circuit 112 is a driver circuit having a function of supplying a potential corresponding to data written to the memory circuit 120 to the wiring 202 and a function of reading data stored in the memory circuit 120 or data obtained by logic operation in the logic circuit 130, from a potential of the wiring 202.

The circuit 113 is connected to the memory circuits 120[1, 1] to [n, m] and the logic circuits 130[1, 1] to [i, m] through the plurality of wirings 202 (wirings 202[1] to [m]). The circuit 113 is a driver circuit having a function of supplying (precharging) a predetermined potential to the wiring 202. Note that with a structure where the circuit 112 has a function of the circuit 113, the circuit 113 can be omitted.

The memory circuit 120 has a function of storing data supplied from the circuit 112 and a function of outputting the data stored in the memory circuit 120 to the wiring 202. Data output to the wiring 202 can be read by the circuit 112. The read data can be output to the circuit 20 (see FIG. 1).

The memory circuit 120 can be constituted with a volatile memory such as a DRAM or an SRAM, or a nonvolatile memory such as a NAND flash memory.

The logic circuit 130 is connected to the memory circuits 120. Moreover, the logic circuit 130 has a function of performing logic operation using data stored in the memory circuit 120 as an input signal and outputting a result of the logic operation to the wiring 202. Here, an example where data stored in two memory circuits 120 which are adjacent to each other in the same column is used as an input signal of the logic circuit 130. For example, the logic circuit 130[1, 1] can perform logic operation using data stored in the memory circuit 120[1, 1] and data stored in the memory circuit 120[2, 1] as input signals and output a result of the logic operation to the wiring 202[1]. The data output to the wiring 202 can be read by the circuit 112. The read data can be output to the circuit 20 (see FIG. 1).

The logic circuit 130 can include a NOT circuit, an AND circuit, an OR circuit, a NOR circuit, a NAND circuit, an XOR circuit, or the like; however, there is no particular limitation.

As described above, the circuit 30 outputs not only data stored in the memory circuit 120 but also a result of logic operation performed using the data stored in the memory circuit 120 as input signals.

Note that the logic circuits 130 are provided over the memory circuits 120 with the insulating layer 101 provided therebetween (see FIG. 2). Alternatively, the logic circuits 130 can be placed so as to have a region overlapping with any of the plurality of memory circuits 120.

Figure 4:
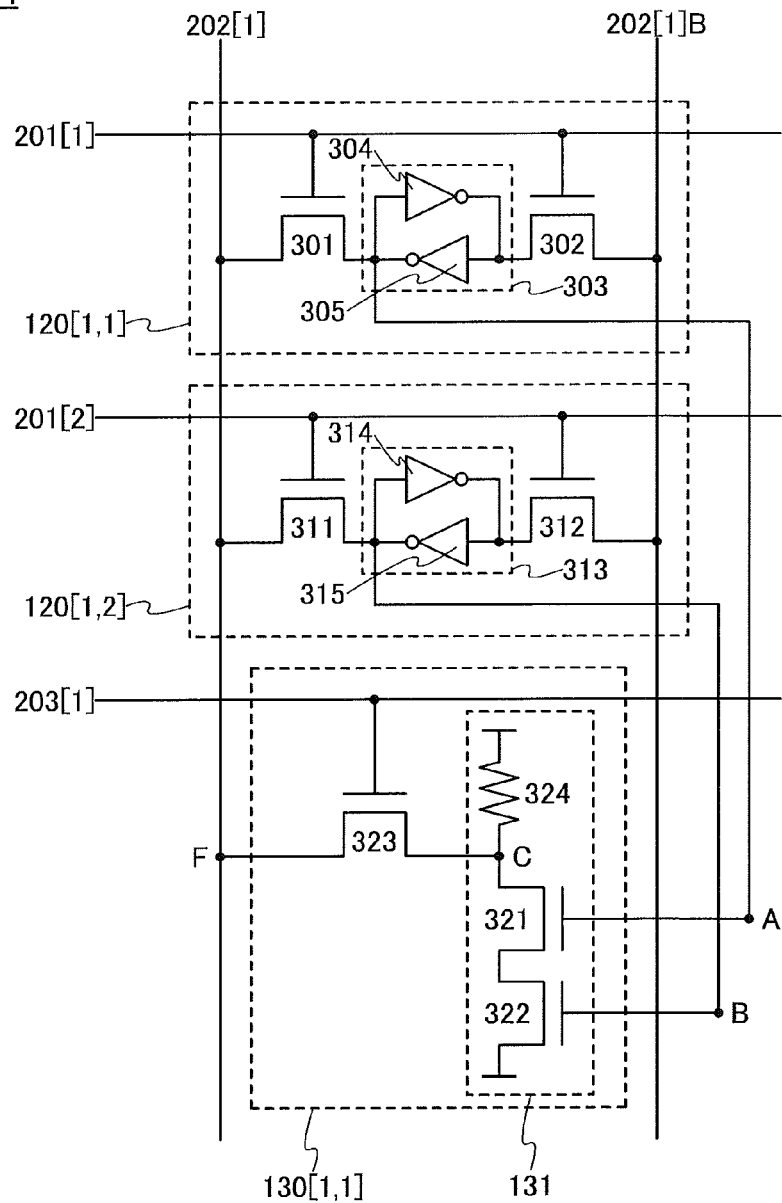
FIG. 4 shows a circuit diagram illustrating an example of a structure of a semiconductor device.

FIG. 4 illustrates an example of a specific structure of the memory circuit 120 and the logic circuit 130. Here, although the structures of the memory circuit 120[1, 1], the memory circuit 120[1, 2], and the logic circuit 130[1, 1] are particularly described, a similar structure can be applied to another memory circuit or logic circuit.

FIG. 4 illustrates the cell array 114 having a structure in which the memory circuit 120[1, 1] and the memory circuit 120[1, 2] include SRAM cells and a structure in which the logic circuit 130[1, 1] includes a NAND circuit.

The memory circuit 120[1, 1] includes a transistor 301, a transistor 302, and a circuit 303. Furthermore, the circuit 303 includes an inverter 304 and an inverter 305. A gate of the transistor 301 is connected to the wiring 201[1], one of a source and a drain of the transistor 301 is connected to the wiring 202[1], and the other of the source and the drain of the transistor 301 is connected to an input terminal of the inverter 304 and an output terminal of the inverter 305. A gate of the transistor 302 is connected to the wiring 201[1], one of a source and a drain of the transistor 302 is connected to the wiring 202[1]B, and the other of the source and the drain of the transistor 302 is connected to an output terminal of the inverter 304 and an input terminal of the inverter 305. Here, the wiring 202[1]B is supplied with an inverted signal of a signal supplied to the wiring 202[1]. As described above, an SRAM cell is formed in the memory circuit 120[1, 1].

The memory circuit 120[1, 2] includes a transistor 311, a transistor 312, and a circuit 313. Furthermore, the circuit 313 includes an inverter 314 and an inverter 315. A gate of the transistor 311 is connected to the wiring 201 [2], one of a source and a drain of the transistor 311 is connected to the wiring 202[1], and the other of the source and the drain of the transistor 311 is connected to an input terminal of the inverter 314 and an output terminal of the inverter 315. A gate of the transistor 312 is connected to the wiring 201 [2], one of a source and a drain of the transistor 312 is connected to the wiring 202[1]B, and the other of the source and the drain of the transistor 312 is connected to an output terminal of the inverter 314 and an input terminal of the inverter 315. As described above, an SRAM cell is formed in the memory circuit 120[1, 2].

Note that the input terminal of the inverter 304 and the output terminal of the inverter 305 are connected to a node A. Furthermore, the input terminal of the inverter 314 and the output terminal of the inverter 315 are connected to a node B. The node A and the node B correspond to an input terminal of the logic circuit 130[1, 1].

The logic circuit 130[1, 1] includes a transistor 321, a transistor 322, a transistor 323, and a resistor 324. A gate of the transistor 321 is connected to the node A, one of a source and a drain of the transistor 321 is connected to one of a source and a drain of the transistor 323 and one terminal of the resistor 324, and the other of the source and the drain of the transistor 321 is connected to one of a source and a drain of the transistor 322. A gate of the transistor 322 is connected to the node B, and the other of the source and the drain of the transistor 322 is connected to a wiring to which a predetermined potential is supplied (here, a low potential power supply line). A gate of the transistor 323 is connected to the wiring 203[1], and the other of the source and the drain of the transistor 323 is connected to the wiring 202[1]. The other terminal of the resistor 324 is connected to a wiring to which a predetermined potential is supplied (here, a high potential power supply line). As described above, the logic circuit 130[1, 1] includes a circuit 131 formed in a NAND circuit.

Note that the other of the source and the drain of the transistor 323 and the wiring 202[1] are connected to a node F. The node F corresponds to an output terminal of the logic circuit 130[1, 1]. Furthermore, a node connected to the one of the source and the drain of the transistor 321, the one of the source and the drain of the transistor 323, and the one terminal of the resistor 324 is referred to as a node C.

The transistors 301, 302, 311, 312, 321, 322, and 323 can be transistors including a single crystal semiconductor or a non-single-crystal semiconductor in their channel formation regions. Alternatively, the transistors 301, 302, 311, 312, 321, 322, and 323 can be OS transistors. The case where the transistors 301, 302, 311, 312, 321, 322, and 323 are n-channel transistors is shown here; however, there is no limitation thereto, and the transistors 301, 302, 311, 312, 321, 322, and 323 each may be an n-channel type or a p-channel type.

The transistors 301, 302, 311, and 312 can be transistors including a single crystal semiconductor in their channel formation regions. Thus, high speed operation of the memory circuit 120 can be achieved. Note that as the single crystal semiconductor, single crystal silicon, single crystal germanium, or the like can be used.

The transistors 321, 322, and 323 can be formed using transistors whose channel formation regions are formed in semiconductor films. For example, the transistors 321, 322, and 323 can be formed using transistors each including a non-single-crystal semiconductor in a channel formation region. As the non-single-crystal semiconductor, non-single-crystal silicon such as amorphous silicon, microcrystalline silicon, or polycrystalline silicon, non-single-crystal germanium such as amorphous germanium, microcrystalline germanium, or polycrystalline germanium, or the like can be used. Alternatively, the transistors 321, 322, and 323 can be formed using OS transistors. Such a transistor whose channel formation region is formed in a semiconductor film can be formed over the insulating layer 101; thus, the logic circuits 130 can be formed over the insulating layer 101. Thus, a structure in which the insulating layer 101 is provided over the memory circuits 120 and the logic circuits 130 are provided over the insulating layer 101 can be employed. That is, a structure in which the memory circuits 120 and the logic circuits 130 are stacked can be obtained.

Here, an off-state current of an OS transistor is extremely small. Therefore, by using OS transistors as the transistors 321, 322, and 323, the logic circuit 130[1, 1] with small off-state leakage and low power consumption can be formed.

Moreover, by using OS transistors as the transistors 301, 302, 311, and 312, in a data retention period, data stored in the memory circuit 120[1, 1] and the memory circuit 120[1, 2] is prevented from leaking to the wiring 202[1] and the wiring 202[1]B, and variation in potentials of the wiring 202[1] and the wiring 202[1]B can be suppressed. Furthermore, by using an OS transistor as the transistor 323, in a period during which the transistor 323 is in a non-conductive state, an output signal of the logic circuit 130[1, 1] is prevented from leaking to the wiring 202[1], and variation in potential of the wiring 202[1] can be suppressed.

Furthermore, the OS transistor can operate at high speed when miniaturized. Therefore, by using OS transistors as the transistors 321, 322, and 323, the operation speed of the logic circuit 130[1, 1] can be increased. In this case, the operation speed of the logic circuit 130[1, 1] can be less than or equal to 10 ns, preferably less than or equal to 5 ns. The channel length of the OS transistor can be less than or equal to 100 nm, preferably less than or equal to 60 nm, further preferably less than or equal to 40 nm, even further preferably less than or equal to 30 nm.

Note that the resistor 324 can be formed using a transistor, for example. In this case, one of a source and a drain of the transistor is connected to the node C, and the other of the source and the drain of the transistor is connected to a wiring to which a predetermined potential is supplied. Although the transistor can be formed using a material similar to that of another transistor, in particular, an OS transistor is preferably used.

Next, an example of the operation of the memory circuit 120[1, 1], the memory circuit 120[1, 2], and the logic circuit 130[1, 1] is described.

<Writing to Memory Circuit>

First, operation of writing data to the memory circuit 120[1, 1] and the memory circuit 120[1, 2] is described. Here, the case where high-level data is written to the memory circuit 120[1, 1] and low-level data is written to the memory circuit 120[1, 2] is described.

First, the potential of the wiring 202[1] is set at high level, and the potential of the wiring 202[1]B is set at low level. Furthermore, the potential of the wiring 201[1] is set at high level, so that the transistor 301 and the transistor 302 are set in a conductive state. Thus, the high-level potential is supplied to the input terminal of the inverter 304 and the output terminal of the inverter 305 and the low-level potential is supplied to the output terminal of the inverter 304 and the input terminal of the inverter 305, so that data is written to the memory circuit 120[1, 1].

Next, the potential of the wiring 201[1] is set at low level. Thus, data written to the memory circuit 120[1, 1] is retained.

Next, the potential of the wiring 202[1] is set at low level and the potential of the wiring 202[1]B is set at high level. Furthermore, the potential of the wiring 201 [2] is set at high level, so that the transistor 311 and the transistor 312 are set in a conductive state. Thus, the low-level potential is supplied to the input terminal of the inverter 314 and the output terminal of the inverter 315 and the high-level potential is supplied to the output terminal of the inverter 314 and the input terminal of the inverter 315, so that data is written to the memory circuit 120[1, 2].

Next, the potential of the wiring 201 [2] is set at low level. Thus, data written to the memory circuit 120[1, 2] is retained.

<Reading from Memory Circuit>

Next, operation of reading data from the memory circuit 120[1, 1] and the memory circuit 120[1, 2] is described. Here, the case where high-level data is read from the memory circuit 120[1, 1] and low-level data is read from the memory circuit 120[1, 2] is described.

First, the potential of the wiring 201[1] is set at high level, so that the transistor 301 is set in the conductive state. Thus, the potentials of the input terminal of the inverter 304 and the output terminal of the inverter 305 are supplied to the wiring 202[1]. Then, by reading the potential of the wiring 202[1], data written to the memory circuit 120[1, 1] can be read.

Next, the potential of the wiring 201 [2] is set at high level, so that the transistor 311 is set in the conductive state. Thus, the potentials of the input terminal of the inverter 314 and the output terminal of the inverter 315 are supplied to the wiring 202[1]. Then, by reading the potential of the wiring 202[1], data written to the memory circuit 120[1, 2] can be read.

Note that during the operation of reading from the above memory circuits, the potential of the wiring 203[1] is set at low level, so that the transistor 323 is set in a conductive state. Thus, data is not output from the logic circuit 130[1, 1] to the wiring 202[1].

<Reading from Logic Circuit>

Next, operation of reading data from the logic circuit 130[1, 1] is described. Here, the case where the logic circuit 130[1, 1] outputs arithmetic results of negative AND using the high-level data written to the memory circuit 120[1, 1] and the low-level data written to the memory circuit 120[1, 2] as input signals is described.

When the arithmetic results are output, the potential of the wiring 203[1] is set at high level. Thus, the transistor 323 is set in the conductive state.

Since the node A is connected to the input terminal of the inverter 304 and the output terminal of the inverter 305 here, the potential of the node A is at high level. In addition, since the node B is connected to the input terminal of the inverter 314 and the output terminal of the inverter 315, the potential of the node B is at low level. That is, high-level data and low-level data are input to the logic circuit 130[1, 1] as input signals.

Furthermore, since the potential of the node A is at high level, the transistor 321 is in a conductive state. Furthermore, since the potential of the node B is at low level, the transistor 322 is set in a non-conductive state. Thus, the potential of the node C is set at high level. Here, since the transistor 323 is in a conductive state, the potential (high-level potential) of the node C is output to the wiring 202[1] through the transistor 323. Then, by reading the potential of the wiring 202[1], a result of logic operation in the logic circuit 130[1, 1] can be read.

Note that during the operation of reading from the above logic circuits, the potentials of the wiring 201[1] and the wiring 201 [2] are set at low level, so that the transistors 301, 302, 311, and 312 are set in a non-conductive state. Thus, data is not output from the memory circuit 120[1, 1] and the memory circuit 120[1, 2].

As described above, when the conductive states of the transistor 301, the transistor 311, and the transistor 323 are controlled by supplying a predetermined signal to the wiring 201[1], the wiring 201 [2], and the wiring 203[1] from the circuit 111 (see FIG. 3), it is possible to control which of data stored in the memory circuit 120[1, 1], data stored in the memory circuit 120[1, 2], and output data of the logic circuit 130[1, 1] is output to the wiring 202[2].

Through the above operations, the cell array 114 can read, in addition to data written to the memory circuit 120, the output signal of the logic circuit 130 which uses data written to the memory circuit 120 as an input signal.

Figure 5:
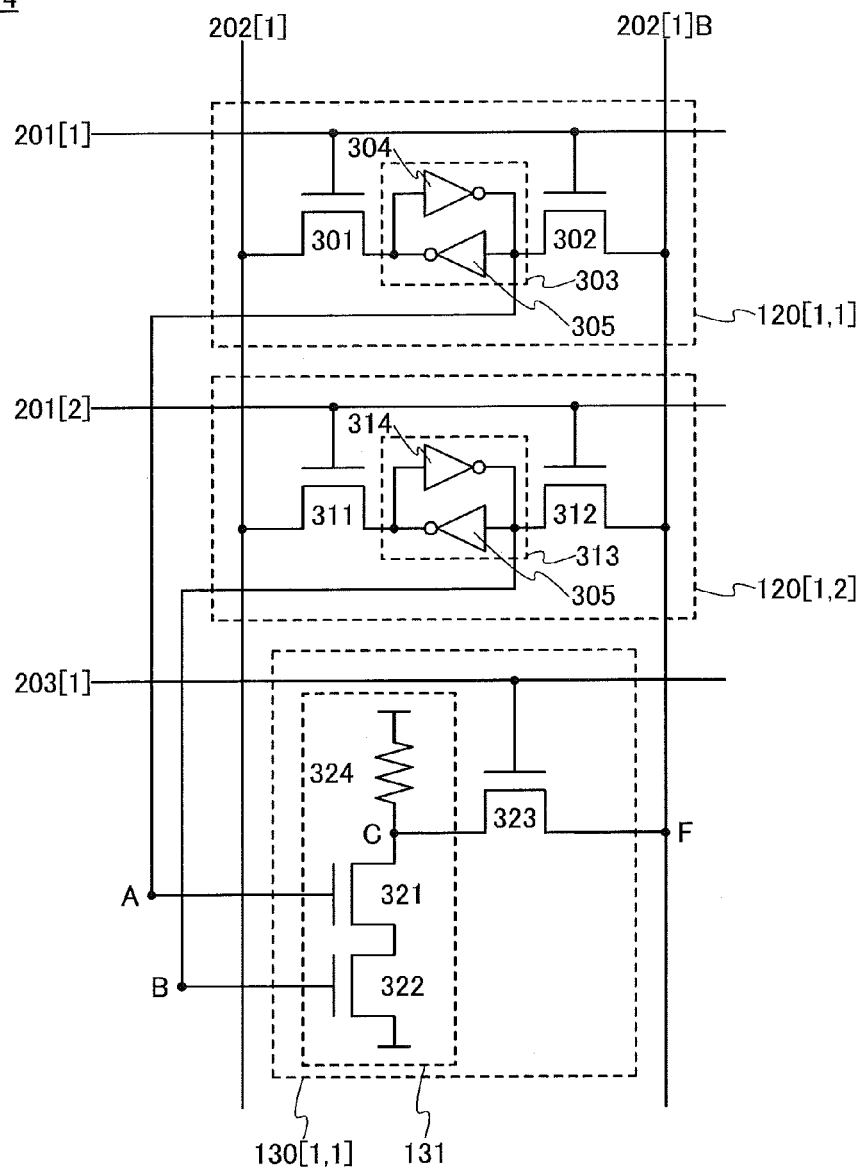
FIG. 5 shows a circuit diagram illustrating an example of a structure of a semiconductor device.

Note that FIG. 4 illustrates a structure in which the potentials of the input terminal of the inverter 304 and the output terminal of the inverter 305 and the potentials of the input terminal of the inverter 314 and the output terminal of the inverter 315 are input signals of the logic circuit 130[1, 1] and the potential of the wiring 202[1] is an output signal of the logic circuit 130[1, 1]; however, there is no limitation thereto. As illustrated in FIG. 5, the structure in which the potentials of the output terminal of the inverter 304 and the input terminal of the inverter 305 and the potentials of the output terminal of the inverter 314 and the input terminal of the inverter 315 are input signals of the logic circuit 130[1, 1] and the potential of the wiring 202[1]B is an output signal of the logic circuit 130[1, 1] may be employed. In that case, the output terminal of the inverter 304 and the input terminal of the inverter 305 are connected to the node A, and the output terminal of the inverter 314 and the input terminal of the inverter 315 are connected to the node B. Furthermore, the node F corresponding to the output terminal of the logic circuit 130[1, 1] is connected to the wiring 202[1]B.

As described above, according to one embodiment of the present invention, the circuit 30 includes the circuit 31 including the memory circuit and the circuit 32 including the logic circuit. Thus, the circuit 30 can function as a memory device having a function of storing data and a function of performing logic operation. In other words, the circuit 30 can output, in addition to data stored in the circuit 31, data corresponding to a result of logic operation using data stored in the circuit 31 as an input signal. Consequently, the circuit 20 can directly obtain a result of logic operation from the circuit 30. Therefore, the frequency of input/output of a signal performed between the circuit 20 and the circuit 30 can be reduced.

Furthermore, without logic operation performed in the circuit 20, a result of logic operation using data stored in the circuit 31 as an input signal can be obtained. Consequently, the time for data processing in the circuit 20 can be shortened. Thus, the operation speed of the semiconductor device 10 can be increased.

This embodiment can be combined with any other embodiment as appropriate.

Embodiment 2

In this embodiment, a structure example of a semiconductor device of one embodiment of the present invention is described.

Figure 6A:
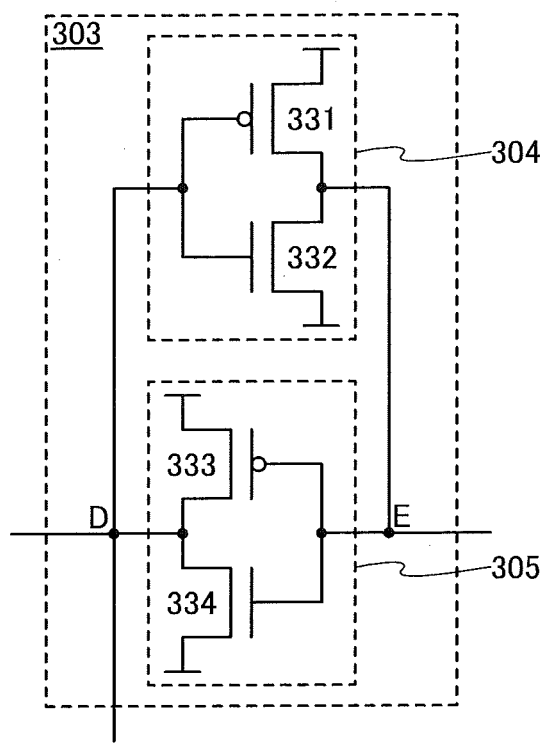
FIGS. 6A-6B show circuit diagrams each illustrating an example of a structure of a semiconductor device.

FIG. 6(A) illustrates an example of a specific structure of the circuit 303 illustrated in FIGS. 4 and 5. The circuit 303 is constituted with the inverter 304 including transistors 331 and 332 and the inverter 305 including transistors 333 and 334.

A gate of the transistor 331 is connected to a gate of the transistor 332, one of a source and a drain of the transistor 331 is connected to one of a source and a drain of the transistor 332, and the other of the source and the drain of the transistor 331 is connected to a wiring to which a predetermined potential is supplied (here, a high potential power supply line). The other of the source and the drain of the transistor 332 is connected to a wiring to which a predetermined potential is supplied (here, a low potential power supply line). A node D connected to the gate of the transistor 331 and the gate of the transistor 332 corresponds to the input terminal of the inverter 304. A node E connected to the one of the source and the drain of the transistor 331 and the one of the source and the drain of the transistor 332 corresponds to the output terminal of the inverter 304.

A gate of the transistor 333 is connected to a gate of the transistor 334, one of a source and a drain of the transistor 333 is connected to one of a source and a drain of the transistor 334, and the other of the source and the drain of the transistor 333 is connected to a wiring to which a predetermined potential is supplied (here, a high potential power supply line). The other of the source and the drain of the transistor 334 is connected to a wiring to which a predetermined potential is supplied (here, a low potential power supply line). The node E connected to the gate of the transistor 333 and the gate of the transistor 334 corresponds to the input terminal of the inverter 305. The node D connected to the one of the source and the drain of the transistor 333 and the one of the source and the drain of the transistor 334 corresponds to the output terminal of the inverter 305.

Here, the transistors 331, 332, 333, and 334 can be transistors including a single crystal semiconductor in their channel formation regions. Thus, high speed operation of the circuit 303 can be achieved.

Furthermore, p-channel transistors other than OS transistors are easily manufactured compared with the OS transistors. Accordingly, the transistors 331 and 333 can be transistors each including a single crystal semiconductor in their channel formation regions and the transistors 332 and 334 can be OS transistors. In this case, the insulating layer 101 (see FIGS. 1 and 2) can be provided over the transistors 331 and 333, and the transistors 332 and 334 can be provided over the insulating layer 101. In addition, the transistor 332 or 334 can be placed so as to have a region overlapping with the transistor 331 or 333. Consequently, the area of the memory circuit 120 can be reduced.

Note that although the structure of the circuit 303 is described here, a similar structure can be applied to the circuit 313 in FIG. 5.

Figure 6B:
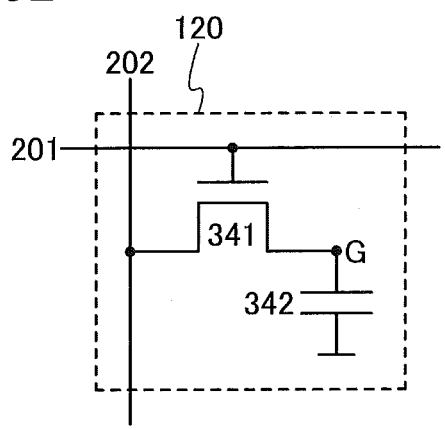

Furthermore, the memory circuit 120 can be constituted with a transistor 341 and a capacitor 342 as illustrated in FIG. 6(B). A gate of the transistor 341 is connected to the wiring 201, one of a source and a drain of the transistor 341 is connected to the wiring 202, and the other of the source and the drain of the transistor 341 is connected to one electrode of the capacitor 342. The other electrode of the capacitor 342 is connected to a wiring to which a predetermined potential is supplied. Note that a node connected to the other of the source and the drain of the transistor 341 and the one electrode of the capacitor 342 is referred to as a node G. As described above, a DRAM cell is formed in the memory circuit 120.

By using the potential of the node G as an input signal of the logic circuit 130, logic operation of data stored in the memory circuit 120 can be performed in the logic circuit 130.

Furthermore, FIGS. 4 and 5 illustrate the structure in which the logic circuit 130 includes the circuit 131 formed in the NAND circuit; however, there is no particular limitation thereto, and the circuit 131 can be formed using another circuit. FIG. 7 illustrates another structural example of the circuit 131.

Figure 7A:
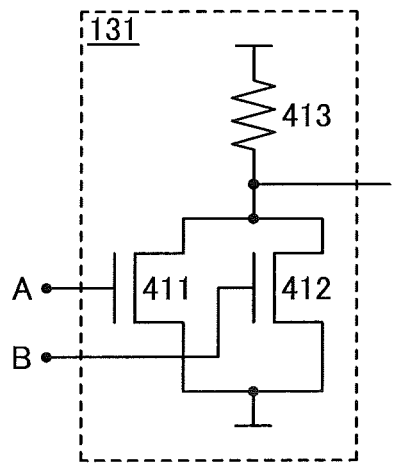
FIGS. 7A-7C show circuit diagrams illustrating examples of a structure of a semiconductor device.

FIG. 7(A) illustrates a structure in the case where a NOR circuit is used as the circuit 131. The circuit 131 includes a transistor 411, a transistor 412, and a resistor 413.

A gate of the transistor 411 is connected to the node A, one of a source and a drain of the transistor 411 is connected to one of a source and a drain of the transistor 412 and one terminal of the resistor 413, and the other of the source and the drain of the transistor 411 is connected to a wiring to which a predetermined potential is supplied (here, a low potential power supply line). A gate of the transistor 412 is connected to the node B, and the other of the source and the drain of the transistor 412 is connected to the wiring to which a predetermined potential is supplied (here, the low potential power supply line). The other terminal of the resistor 413 is connected to a wiring to which a predetermined potential is supplied (here, a high potential power supply line). A node connected to the one of the source and the drain of the transistor 411, the one of the source and the drain of the transistor 412, and the one terminal of the resistor 413 is connected to the node F through the transistor 323 (see FIG. 4).

Figure 7B:
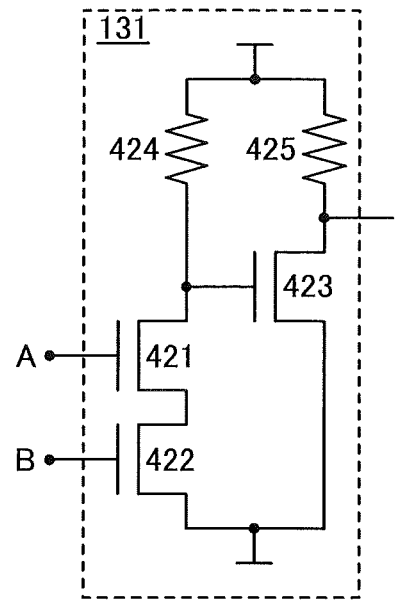

FIG. 7(B) illustrates a structure in the case where an AND circuit is used as the circuit 131. The circuit 131 includes a transistor 421, a transistor 422, a transistor 423, a resistor 424, and a resistor 425.

A gate of the transistor 421 is connected to the node A, one of a source and a drain of the transistor 421 is connected to one of a source and a drain of the transistor 422, and the other of the source and the drain of the transistor 421 is connected to a gate of the transistor 423 and one terminal of the resistor 424. A gate of the transistor 422 is connected to the node B, and the other of the source and the drain of the transistor 422 is connected to a wiring to which a predetermined potential is supplied (here, a low potential power supply line). One of a source and a drain of the transistor 423 is connected to a wiring to which a potential is supplied (here, the low potential power supply line), and the other of the source and the drain of the transistor 423 is connected to one terminal of the resistor 425. The other terminal of the resistor 424 is connected to a wiring to which a predetermined potential is supplied (here, a high potential power supply line). The other terminal of the resistor 425 is connected to the wiring to which a predetermined potential is supplied (here, the high potential power supply line). A node connected to the other of the source and the drain of the transistor 423 and the one terminal of the resistor 425 is connected to the node F through the transistor 323 (see FIG. 4).

Figure 7C:
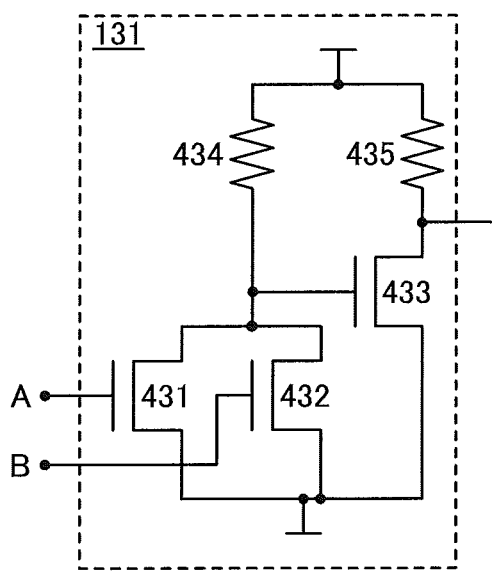

FIG. 7(C) illustrates a structure in the case where an OR circuit is used as the circuit 131. The circuit 131 includes a transistor 431, a transistor 432, a transistor 433, a resistor 434, and a resistor 435.

A gate of the transistor 431 is connected to the node A, one of a source and a drain of the transistor 431 is connected to one of a source and a drain of the transistor 432, a gate of the transistor 433, and one terminal of the resistor 434, and the other of the source and the drain of the transistor 431 is connected to a wiring to which a predetermined potential is supplied (here, a low potential power supply line). A gate of the transistor 432 is connected to the node B, and the other of the source and the drain of the transistor 432 is connected to the wiring to which a predetermined potential is supplied (here, the low potential power supply line). One of a source and a drain of the transistor 433 is connected to one terminal of the resistor 435, and the other of the source and the drain of the transistor 433 is connected to the wiring to which a predetermined potential is supplied (here, the low potential power supply line). The other terminal of the resistor 434 is connected to a wiring to which a predetermined potential is supplied (here, a high potential power supply line). The other terminal of the resistor 435 is connected to the wiring to which a predetermined potential is supplied (here, the high potential power supply line). A node connected to the one of the source and the drain of the transistor 433 and the one terminal of the resistor 435 is connected to the node F through the transistor 323 (see FIG. 4).

Note that the resistors 413, 424, 425, 434, and 435 can be formed using transistors, for example. The transistors can be formed using a material similar to that of the other transistors, in particular, preferably using OS transistors.

As described above, circuits having a variety of structures can be applied to the memory circuits 120 and the logic circuits 130.

This embodiment can be combined with any other embodiment as appropriate.

Embodiment 3

In this embodiment, a structure of a transistor which can be used for a memory circuit or a logic circuit is described.

FIG. 8 illustrates an example of a method for manufacturing a semiconductor device having a structure in which a transistor 520 and a transistor 530 are stacked. Here, description is made on the case where the transistor 520 includes a single crystal semiconductor in a channel formation region and the transistor 530 is an OS transistor.

Figure 8A:
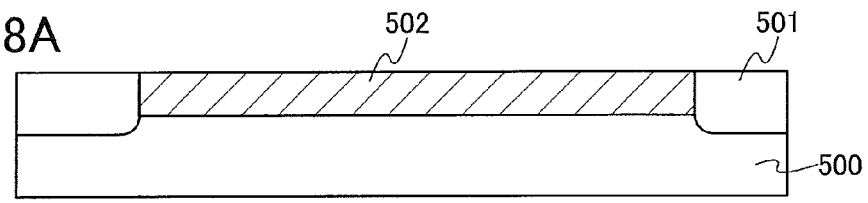
FIGS. 8A-8D show diagrams illustrating an example of a structure of a transistor.

First, an element isolation insulator 501 and an N-type well 502 are formed in a semiconductor substrate 500 (see FIG. 8(A)).

Next, a gate insulating film 503 and a gate electrode 504 are formed, and a P-type impurity region 505 is provided in the well 502. A layer which includes a higher conductivity material (such as silicide) than the impurity region 505 may be stacked over the impurity region 505. Furthermore, the impurity region 505 may include an extension region.

Next, an interlayer insulating layer 506 is formed. The interlayer insulating layer 506 may be a single layer or a multilayer. In addition, the interlayer insulating layer 506 is preferably a layer having a function of supplying oxygen to a layer provided over the interlayer insulating layer 506 and a function of blocking entry of hydrogen or water from a layer provided below the interlayer insulating layer 506 to the layer provided over the interlayer insulating layer 506.

Figure 8B:
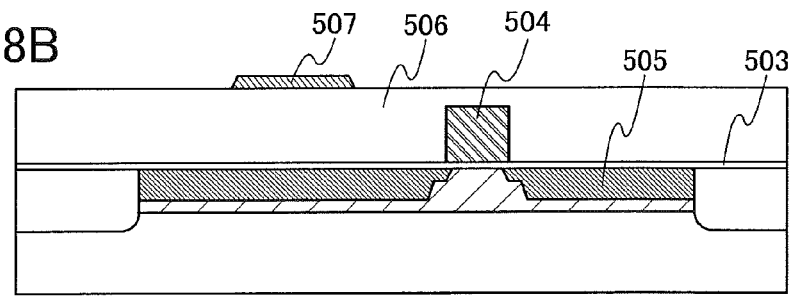
Figure 8C:
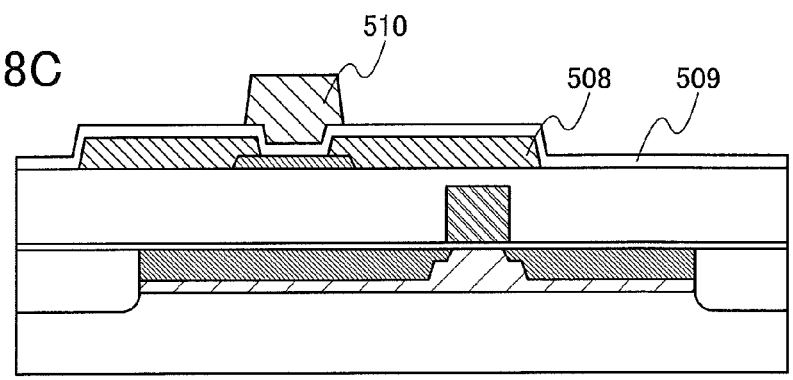

Next, an oxide semiconductor layer 507 is formed over the interlayer insulating layer 506 (see FIG. 8(B)).

Next, a conductive material covering the oxide semiconductor layer 507 is formed. The conductive material may be a single layer or a multilayer. Then, the conductive material is selectively etched to form a wiring 508. Note that the wiring 508 may be a single layer or a multilayer.

Next, a gate insulating film 509 covering the wiring 508 is formed. Moreover, a conductive material is deposited over the gate insulating film 509. The conductive material may be a single layer or a multilayer. Furthermore, the conductive material preferably has a function of blocking entry of hydrogen or water from a layer provided over the conductive material to the layer provided below the conductive material. Then, the conductive material is selectively etched to form a gate electrode 510 (see FIG. 8(C)).

Next, an interlayer insulating layer 511 is deposited. Then, a contact hole reaching the gate electrode 510 is formed in the interlayer insulating layer 511, a contact hole reaching the impurity region 505 is formed in the interlayer insulating layer 511, the gate insulating film 509, the interlayer insulating layer 506, and the gate insulating film 503, and these contact holes are filled with a conductive material, whereby a wiring 512 is formed (see FIG. 8(D)). The wiring 512 may have a structure in which a contact plug is included in the contact hole. The wiring 512 may be a single layer or a multilayer.

As described above, the semiconductor device in which the transistor 520 including a single crystal semiconductor in a channel formation region and the transistor 530 that is an OS transistor are stacked can be manufactured.

In FIG. 8, the impurity region 505 is connected to the gate electrode 510 through the wiring 512. That is, one of a source and a drain of the transistor 520 is connected to a gate of the transistor 530. Such a structure can be applied to the transistors in FIGS. 4 to 7. For example, the transistor 520 corresponds to the transistors 301 and 311 and the like in FIG. 4, and the transistor 530 corresponds to the transistors 321 and 322 and the like in FIG. 4.

Note that the connection between the transistor 520 and the transistor 530 is not limited to that shown in FIG. 8. For example, as shown in FIG. 9(A), a structure in which the impurity region 505 is connected to the wiring 508 can be employed. Thus, a structure in which one of the source and the drain of the transistor 520 is connected to one of a source and a drain of the transistor 530 can be obtained.

Figure 9A:
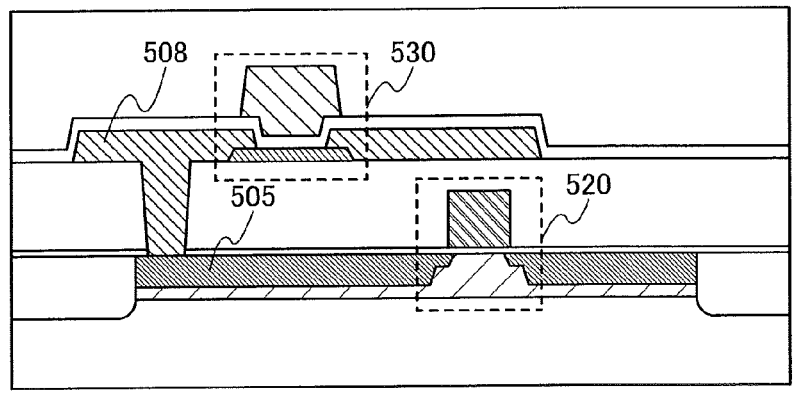
FIGS. 9A-9C show diagrams illustrating an example of a structure of a transistor.
Figure 9B:
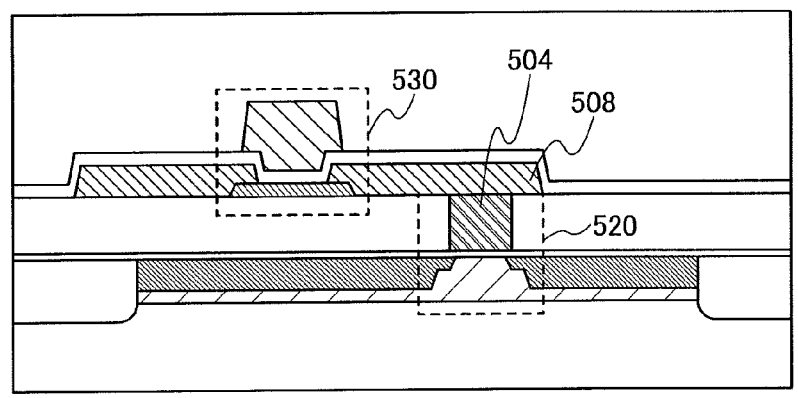

Furthermore, as shown in FIG. 9(B), a structure in which the gate electrode 504 is connected to the wiring 508 can be employed. Thus, a structure in which a gate of the transistor 520 is connected to the one of the source and the drain of the transistor 530 can be obtained.

Figure 9C:
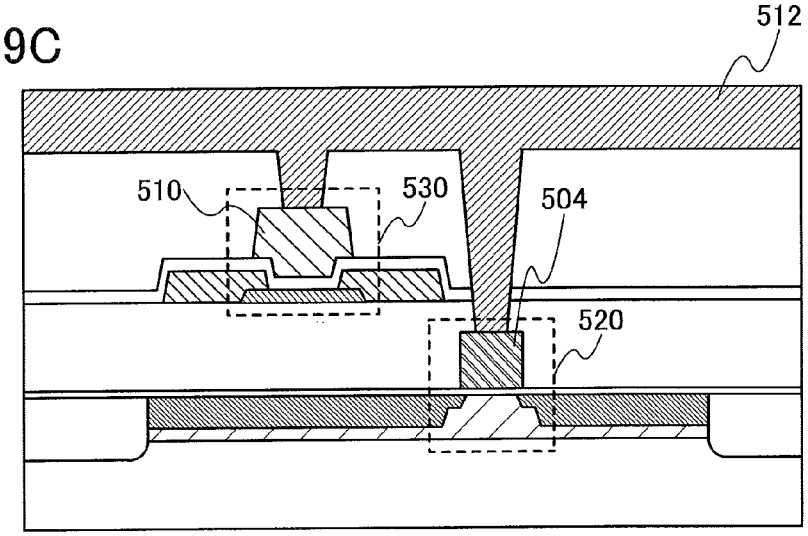

Furthermore, as shown in FIG. 9(C), a structure in which the gate electrode 504 is connected to the gate electrode 510 through the wiring 512 can be employed. Accordingly, a structure in which the gate of the transistor 520 is connected to the gate of the transistor 530 can be obtained.

Figure 8D:
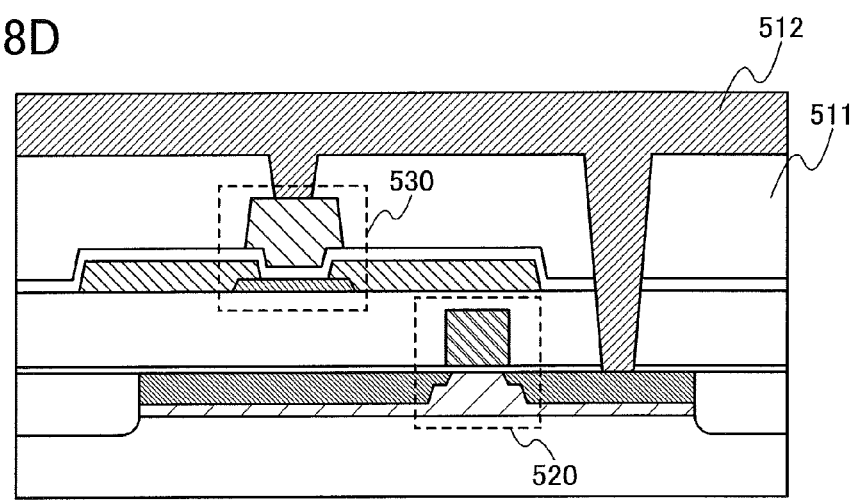

The stacked-layer structure of the transistors in FIG. 8(D) and FIG. 9 can be appropriately used for the transistors in FIGS. 4 to 7.

This embodiment can be implemented in appropriate combination with any of the other embodiments.

Embodiment 4

In this embodiment, a structure of a transistor which can be used for a memory circuit or a logic circuit is described.
<Example of Cross-Sectional Structure of Semiconductor Device>

Figure 10:
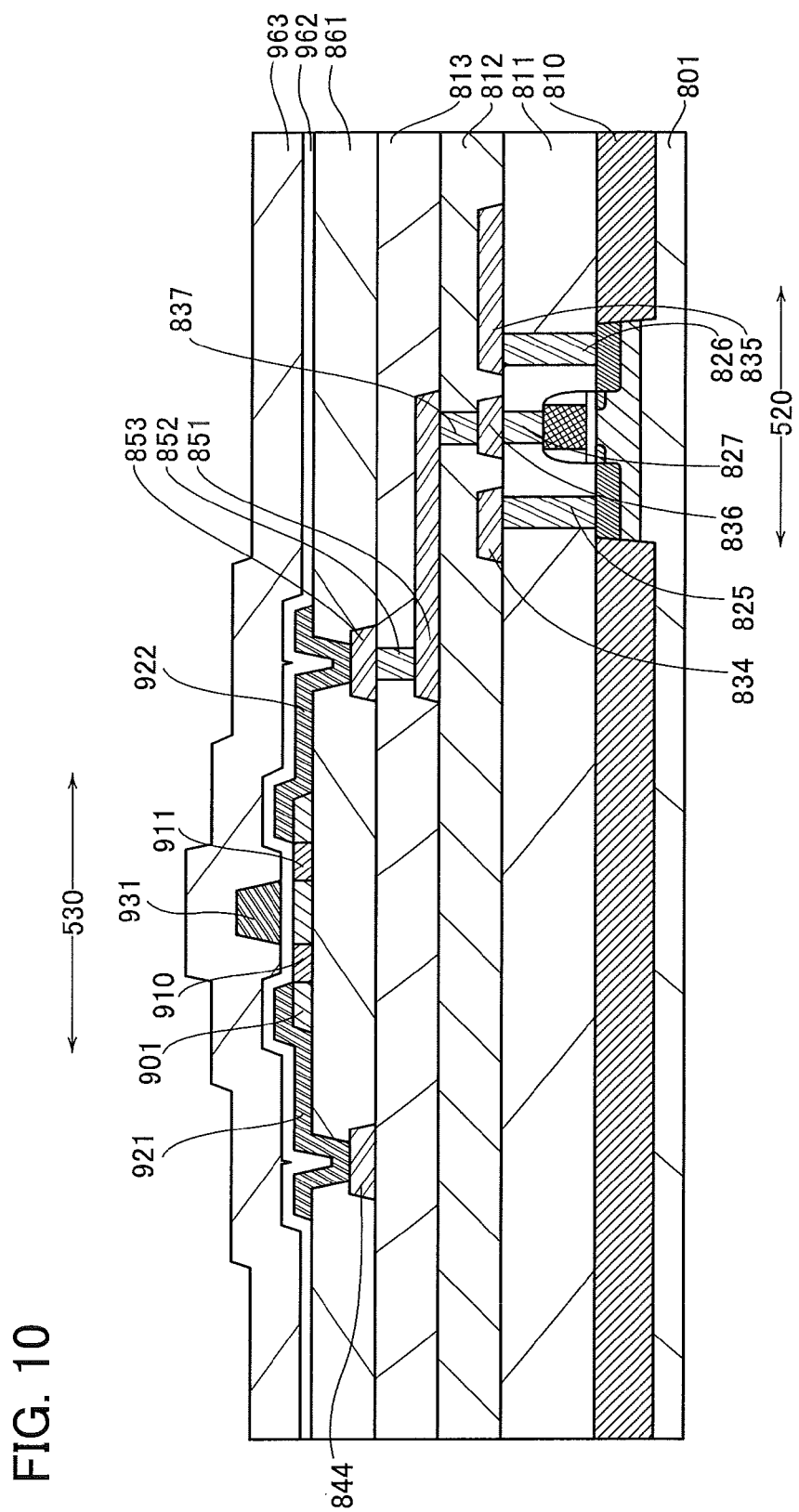
FIG. 10 shows a diagram illustrating an example of a structure of a transistor.

FIG. 10 shows an example of the structure of the transistors 520 and 530. Note that FIG. 10 illustrates an example in which the transistor 530 that is an OS transistor is formed over the transistor 520 that is a transistor whose channel formation region is formed in a single-crystal silicon substrate (hereinafter also referred to as a Si transistor). Note that the structure in which a Si transistor and an OS transistor are stacked in this manner can be used for the circuit 30 as appropriate. Note that in this embodiment, as in FIG. 9(B), the gate of the transistor 520 is connected to the one of the source and the drain of the transistor 530; however, there is no limitation thereto. The one of the source and the drain of the transistor 520 may be connected to the gate of the transistor 530 (see FIG. 8(D)), the one of the source and the drain of the transistor 520 may be connected to the one of the source and the drain of the transistor 530 (see FIG. 9(A)), or the gate of the transistor 520 may be connected to the gate of the transistor 530 (see FIG. 9(C)).

The transistor 520 may include its channel formation region in a semiconductor film or a semiconductor substrate of silicon, germanium, or the like in an amorphous, microcrystalline, polycrystalline, or single crystal state. Alternatively, the transistor 520 may include its channel formation region in an oxide semiconductor film or an oxide semiconductor substrate. In the case where the transistors each include its channel formation region in an oxide semiconductor film or an oxide semiconductor substrate, the transistor 530 is not necessarily stacked over the transistor 520, and the transistor 530 and the transistor 520 may be formed in the same layer.

In the case where the transistor 520 is formed using a thin silicon film, it is possible to use, in the thin film, amorphous silicon formed by a vapor phase growth method such as a plasma-enhanced CVD (Chemical Vapor Deposition) method or a sputtering method, polycrystalline silicon obtained by crystallization of amorphous silicon by treatment such as laser annealing, single crystal silicon obtained by separation of a surface portion of a single crystal silicon wafer by implantation of hydrogen ions or the like into the single crystal silicon wafer, and the like.

A semiconductor substrate 801 where the transistor 520 is formed can be, for example, a silicon substrate, a germanium substrate, a silicon germanium substrate, or the like. FIG. 10 illustrates the case where a single crystal silicon substrate is used as the semiconductor substrate 801.

Furthermore, the transistor 520 is electrically isolated by an element isolation method. As the element isolation method, a selective oxidation method (LOCOS method: Local Oxidation of Silicon method), a trench isolation method (STI method: Shallow Trench Isolation method), or the like can be used. FIG. 10 illustrates the case where the trench isolation method is used to electrically isolate the transistor 520. Specifically, FIG. 10 illustrates the case where the transistor 520 is element-isolated with an element isolation region 810 formed in such a manner that a trench is formed in the semiconductor substrate 801 by etching or the like and then, an insulator including silicon oxide or the like is buried in the trench.

An insulating film 811 is provided over the transistor 520. Openings are formed in the insulating film 811. A conductive film 825 and a conductive film 826 that are electrically connected to the source or the drain of the transistor 520 and a conductive film 827 that is electrically connected to the gate of the transistor 520 are formed in the openings.

Furthermore, the conductive film 825 is electrically connected to a conductive film 834 formed over the insulating film 811, the conductive film 826 is electrically connected to a conductive film 835 formed over the insulating film 811, and the conductive film 827 is electrically connected to a conductive film 836 formed over the insulating film 811.

An insulating film 812 is formed over the conductive film 834 to the conductive film 836. An opening is formed in the insulating film 812, and a conductive film 837 electrically connected to the conductive film 836 is formed in the opening. Furthermore, the conductive film 837 is electrically connected to a conductive film 851 formed over the insulating film 812.

Furthermore, an insulating film 813 is formed over the conductive film 851. An opening is formed in the insulating film 813, and a conductive film 852 electrically connected to the conductive film 851 is formed in the opening. In addition, the conductive film 852 is electrically connected to a conductive film 853 formed over the insulating film 813. Furthermore, a conductive film 844 is formed over the insulating film 813.

An insulating film 861 is formed over the conductive film 853 and the conductive film 844. Furthermore, in FIG. 10, the transistor 530 is formed over the insulating film 861.

The transistor 530 includes, over the insulating film 861, a semiconductor film 901 including an oxide semiconductor, a conductive film 921 and a conductive film 922 functioning as a source and a drain over the semiconductor film 901, a gate insulating film 962 over the semiconductor film 901, the conductive film 921, and the conductive film 922, and a gate electrode 931 which is over the gate insulating film 962 and overlaps with the semiconductor film 901 between the conductive film 921 and the conductive film 922. Note that the conductive film 922 is electrically connected to the conductive film 853 in an opening formed in the insulating film 861. Furthermore, the conductive film 921 is electrically connected to the conductive film 844 in an opening formed in the insulating film 861.

Furthermore, in the semiconductor film 901 of the transistor 530, there is a region 910 between a region overlapping with the conductive film 921 and a region overlapping with the gate electrode 931. In addition, in the semiconductor film 901 of the transistor 530, there is a region 911 between a region overlapping with the conductive film 922 and a region overlapping with the gate electrode 931. When argon, an impurity which imparts p-type conductivity to the semiconductor film 901, or an impurity which imparts n-type conductivity to the semiconductor film 901 is added to the region 910 and the region 911 using the conductive film 921, the conductive film 922, and the gate electrode 931 as masks, the resistivity of the region 910 and the region 911 can be made lower than that of the region overlapping with the gate electrode 931 in the semiconductor film 901.

Furthermore, an insulating film 963 is provided over the transistor 530.

Note that in FIG. 10, the transistor 530 has the gate electrode 931 on at least one side of the semiconductor film 901, and alternatively, may have a pair of gate electrodes with the semiconductor film 901 positioned therebetween.

In the case where the transistor 530 has a pair of gate electrodes with the semiconductor film 901 positioned therebetween, one of the gate electrodes may be supplied with a signal for controlling the on state or the off state, and the other of the gate electrodes may be supplied with another signal. In this case, potentials with the same level may be supplied to the pair of gate electrodes, or a fixed potential such as the ground potential may be supplied only to the other of the gate electrodes. By controlling the level of the potential supplied to the other of the gate electrodes, the threshold voltage of the transistor can be controlled.

Moreover, FIG. 10 illustrates the case where the transistor 530 has a single-gate structure including one channel formation region corresponding to one gate electrode 931. However, the transistor 530 may have a multi-gate structure where a plurality of electrically connected gate electrodes are provided so that a plurality of channel formation regions are included in one active layer.

<Transistor>

Then, structure examples of the OS transistor will be described.

Figure 11A:
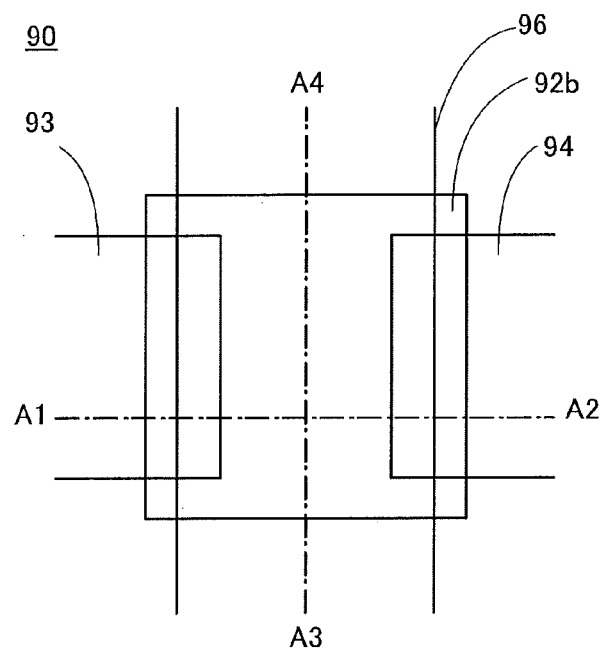
FIGS. 11A-11C show diagrams illustrating an example of a structure of a transistor.
Figure 11C:
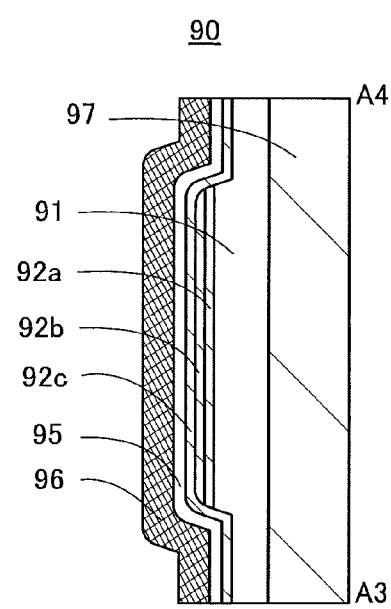
Figure 11B:
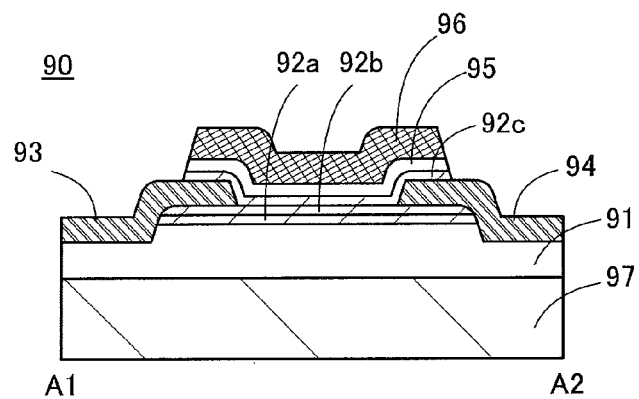

FIG. 11 illustrates a structure of a transistor 90 that is an OS transistor as an example. FIG. 11(A) is a top view of the transistor 90. Note that various insulating films are not illustrated in FIG. 11(A) in order to clarify the layout of the transistor 90. Furthermore, FIG. 11(B) is a cross-sectional view along dashed-dotted line A1-A2 and FIG. 11(C) is a cross-sectional view along dashed-dotted line A3-A4 in the top view in FIG. 11(A).

As illustrated in FIG. 11, the transistor 90 includes an oxide semiconductor film 92a and an oxide semiconductor film 92b that are stacked in this order over an insulating film 91 formed over a substrate 97; a conductive film 93 and a conductive film 94 that are electrically connected to the oxide semiconductor film 92b and function as a source electrode and a drain electrode; an oxide semiconductor film 92c over the oxide semiconductor film 92b, the conductive film 93, and the conductive film 94; an insulating film 95 that has a function as a gate insulating film and is located over the oxide semiconductor film 92c; and a conductive film 96 that has a function as a gate electrode, lies over the insulating film 95, and overlaps with the oxide semiconductor film 92a to the oxide semiconductor film 92c. Note that the substrate 97 may be a glass substrate, a semiconductor substrate, or the like or may be an element substrate where semiconductor elements are formed on a glass substrate or a semiconductor substrate.

Figure 12A:
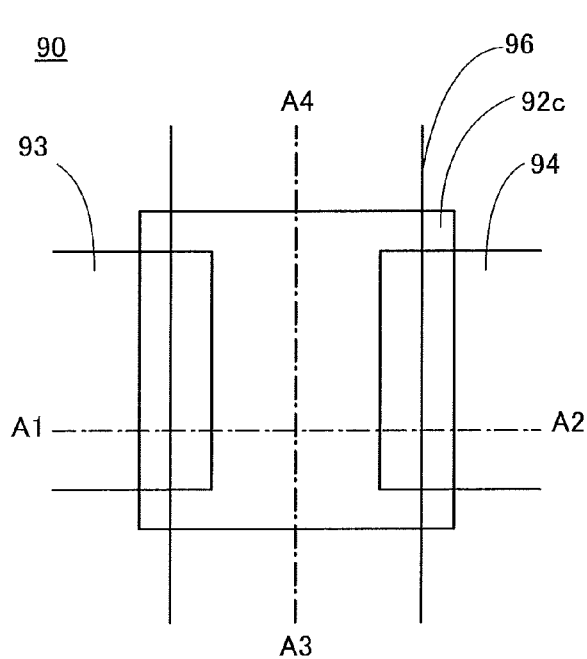
FIGS. 12A-12C show diagrams illustrating an example of a structure of a transistor.
Figure 12C:
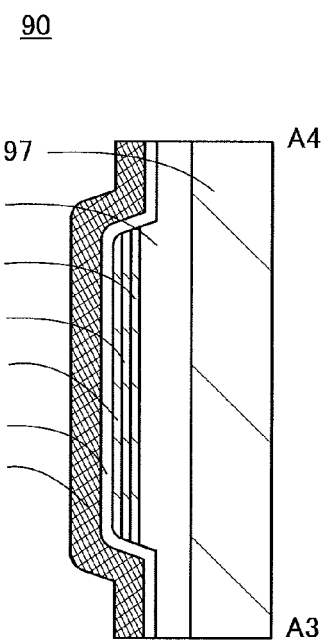
Figure 12B:
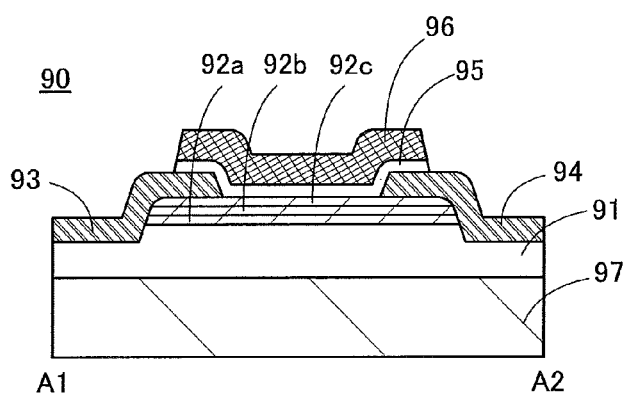

Furthermore, FIG. 12 illustrates another specific example of the structure of the transistor 90. FIG. 12(A) is a top view of the transistor 90. Note that various insulating films are not illustrated in FIG. 12(A) in order to clarify the layout of the transistor 90. FIG. 12(B) is a cross-sectional view along dashed line A1-A2 and FIG. 12(C) is a cross-sectional view along dashed line A3-A4 in the top view in FIG. 12(A).

As illustrated in FIG. 12, the transistor 90 includes the oxide semiconductor film 92a to the oxide semiconductor film 92c that are stacked in this order over the insulating film 91; the conductive film 93 and the conductive film 94 that are electrically connected to the oxide semiconductor film 92c and have a function as a source electrode and a drain electrode; the insulating film 95 that has a function as a gate insulating film and is located over the oxide semiconductor film 92c, the conductive film 93, and the conductive film 94; and the conductive film 96 that has a function as a gate electrode, lies over the insulating film 95, and overlaps with the oxide semiconductor film 92a to the oxide semiconductor film 92c.

Note that FIG. 11 and FIG. 12 each illustrate the structure example of the transistor 90 in which the oxide semiconductor film 92a to the oxide semiconductor film 92c are stacked. The oxide semiconductor film included in the transistor 90 is not necessarily a stack of a plurality of oxide semiconductor films but may be a single oxide semiconductor film.

In the case where the transistor 90 includes the semiconductor film in which the oxide semiconductor film 92a to the oxide semiconductor film 92c are stacked in this order, each of the oxide semiconductor film 92a and the oxide semiconductor film 92c is an oxide film that contains at least one of metal elements contained in the oxide semiconductor film 92b as its component and in which energy at the conduction band minimum is closer to the vacuum level than that in the oxide semiconductor film 92b by higher than or equal to 0.05 eV, higher than or equal to 0.07 eV, higher than or equal to 0.1 eV, or higher than or equal to 0.15 eV and lower than or equal to 2 eV, lower than or equal to 1 eV, lower than or equal to 0.5 eV, or lower than or equal to 0.4 eV. Furthermore, the oxide semiconductor film 92b preferably contains at least indium because carrier mobility is increased.

In the case where the transistor 90 includes the semiconductor films with the above structure, when an electric field is applied to the semiconductor films by applying voltage to the gate electrode, a channel region is formed in the oxide semiconductor film 92b which has the lowest conduction band minimum among the semiconductor films. That is, since the oxide semiconductor film 92c is provided between the oxide semiconductor film 92b and the insulating film 95, a channel region can be formed in the oxide semiconductor film 92b which is separated from the insulating film 95.

Furthermore, since the oxide semiconductor film 92c contains at least one of metal elements contained in the oxide semiconductor film 92b, interface scattering is unlikely to occur at the interface between the oxide semiconductor film 92b and the oxide semiconductor film 92c. Thus, the movement of carriers is unlikely to be inhibited at the interface, which results in an increase in the field-effect mobility of the transistor 90.

Furthermore, when an interface state is formed at the interface between the oxide semiconductor film 92b and the oxide semiconductor film 92a, a channel region is formed also in a region close to the interface, which varies the threshold voltage of the transistor 90. However, since the oxide semiconductor film 92a contains at least one of metal elements contained in the oxide semiconductor film 92b as its component, an interface state is unlikely to be formed at the interface between the oxide semiconductor film 92b and the oxide semiconductor film 92a. Accordingly, the above structure can reduce variations in the electrical characteristics of the transistor 90, such as the threshold voltage.

Furthermore, it is preferable that a plurality of oxide semiconductor films be stacked so that an interface state due to an impurity existing between the oxide semiconductor films, which inhibits carrier flow, is not formed at an interface between the oxide semiconductor films. This is because when an impurity exists between the stacked oxide semiconductor films, the energy continuity of the conduction band minimum between the oxide semiconductor films is lost, and carriers are trapped or disappear by recombination in the vicinity of the interface. By reducing an impurity existing between the films, a continuous junction (here, in particular, a well structure having a U shape in which the conduction band minimum is changed continuously between the films) is formed easily as compared with the case of merely stacking the plurality of oxide semiconductor films which contain at least one common metal as a main component.

In order to form such a continuous junction, it is necessary to form films continuously without being exposed to air, with use of a multi-chamber deposition apparatus (sputtering apparatus) including a load lock chamber. Each chamber in the sputtering apparatus is preferably subjected to high vacuum evacuation (to a vacuum of $5\times10^{-7}$ Pa to $1\times10^{-4}$ Pa) with use of a suction vacuum evacuation pump such as a cryopump so that water or the like, which is an impurity for an oxide semiconductor, is removed as much as possible. Alternatively, a turbo molecular pump and a cold trap are preferably used in combination to prevent backflow of gas into the chamber through an evacuation system.

To obtain a highly purified intrinsic oxide semiconductor, not only high vacuum evacuation of the chambers but also high purification of a gas used in the sputtering is important. When an oxygen gas or an argon gas used as the above gas has a dew point of $-40°$ C. or lower, preferably $-80°$ C. or lower, further preferably $-100°$ C. or lower and the used gas is tried to be highly purified, moisture and the like can be prevented from entering the oxide semiconductor film as much as possible. Specifically, in the case where the oxide semiconductor film 92b is an In-M-Zn oxide (M represents Ga, Y, Zr, La, Ce, or Nd) and a target having the atomic ratio of metal elements of In:M:Zn=$x_1$:$y_1$:$z_1$ is used for forming the oxide semiconductor film 92b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS (C-Axis Aligned Crystalline Oxide Semiconductor) film as the oxide semiconductor film 92b is easily formed. Typical examples of the atomic ratio of the metal elements of the target are In:M:Zn=1:1:1, In:M:Zn=3:1:2, and the like. Note that the CAAC-OS will be described in detail later.

Specifically, in the case where the oxide semiconductor film 92a and the oxide semiconductor film 92c are an In-M-Zn oxide film (M represents Ga, Y, Zr, La, Ce, or Nd) and a target having the atomic ratio of metal elements of In:M:Zn=$x_2$:$y_2$:$z_2$ is used for forming the oxide semiconductor film 92a and the oxide semiconductor film 92c, $x_2/y_2 < x_1/y_1$ is satisfied and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor film 92a and the oxide semiconductor film 92c. Typical examples of the atomic ratio of the metal elements of the target are In:M:Zn=1:3:2, In:M:Zn=1:3:4, In:M:Zn=1:3:6, In:M:Zn=1:3:8, and the like.

Note that the oxide semiconductor film 92a and the oxide semiconductor film 92c each have a thickness of more than or equal to 3 nm and less than or equal to 100 nm, preferably more than or equal to 3 nm and less than or equal to 50 nm. Furthermore, the thickness of the oxide semiconductor film 92b is more than or equal to 3 nm and less than or equal to 200 nm, preferably more than or equal to 3 nm and less than or equal to 100 nm, further preferably more than or equal to 3 nm and less than or equal to 50 nm.

In the three-layer semiconductor film, the oxide semiconductor film 92a to the oxide semiconductor film 92c can be either amorphous or crystalline. Note that the oxide semiconductor film 92b is preferably crystalline because when the oxide semiconductor film 92b in which a channel region is formed is crystalline, the transistor 90 can have stable electrical characteristics.

Note that a channel formation region refers to a region of a semiconductor film of the transistor 90 that overlaps with a gate electrode and is between a source electrode and a drain electrode. Furthermore, a channel region refers to a region through which current mainly flows in the channel formation region.

For example, when an In—Ga—Zn oxide film formed by a sputtering method is used as each of the oxide semiconductor film 92a and the oxide semiconductor film 92c, for the deposition of the oxide semiconductor film 92a and the oxide semiconductor film 92c, an In—Ga—Zn oxide (In:Ga:Zn=1:3:2 [atomic ratio]) target can be used. The deposition conditions can be as follows: an argon gas at a flow rate of 30 sccm and an oxygen gas at a flow rate of 15 sccm are used as the deposition gas; the pressure is 0.4 Pa; the substrate temperature is 200° C.; and the DC power is 0.5 kW.

Furthermore, when the oxide semiconductor film 92b is a CAAC-OS film, for the deposition of the oxide semiconductor film 92b, a polycrystalline target containing an In—Ga—Zn oxide (In:Ga:Zn=1:1:1 [atomic ratio]) is preferably used. The deposition conditions can be as follows: an argon gas at a flow rate of 30 sccm and an oxygen gas at a flow rate of 15 sccm are used as the deposition gas; the pressure is 0.4 Pa; the substrate temperature is 300° C.; and the DC power is 0.5 kW. Furthermore, when the oxide semiconductor film 92b is a CAAC-OS film, for the deposition of the oxide semiconductor film 92b, an In—Ga—Zn oxide target (In: Ga:Zn=2:1:3 [atomic ratio] is preferably used. In the CAAC-OS film deposited with the use of the target, the proportion of a region where a diffraction pattern of the CAAC-OS is observed in a predetermined area (also referred to as proportion of CAAC) can be high. As a result, the frequency characteristics (f characteristics) of a transistor including a channel formation region in the CAAC-OS film can be high.

Note that the oxide semiconductor films 92a to 92c can be formed by a sputtering method.

Note that there are few carrier generation sources in a highly purified oxide semiconductor (purified Oxide Semiconductor) obtained by reduction in impurities such as moisture and hydrogen serving as electron donors (donors) and reduction in oxygen vacancies; therefore, the highly purified oxide semiconductor can be i-type (intrinsic) or substantially i-type. For this reason, a transistor having a channel formation region in a highly purified oxide semiconductor film has an extremely low off-state current and high reliability. Thus, a transistor whose channel formation region is formed in the oxide semiconductor film easily has an electrical characteristic of a positive threshold voltage (also referred to as a normally-off characteristic).

Specifically, various experiments can prove a low off-state current of a transistor having a channel formation region in a highly purified oxide semiconductor film. For example, even when an element has a channel width of $1\times10^6$ μm and a channel length of 10 μm, off-state current can be less than or equal to the measurement limit of a semiconductor parameter analyzer, i.e., less than or equal to $1\times10^{-13}$ A, at a voltage (drain voltage) between the source electrode and the drain electrode of from 1 V to 10 V. In that case, it can be seen that the off-state current of the transistor normalized on the channel width is lower than or equal to 100 zA/μm. In addition, a capacitor and a transistor were connected to each other and off-state current was measured using a circuit in which charges flowing to the capacitor or flowing from the capacitor are controlled by the transistor. In the measurement, a highly purified oxide semiconductor film was used for a channel formation region of the transistor, and the off-state current of the transistor was measured from a change in the amount of charge of the capacitor per unit time. As a result, it was found that, in the case where the voltage between the source electrode and the drain electrode of the transistor is 3 V, a lower off-state current of several tens of yA/μm is obtained. Accordingly, the transistor including a channel formation region in the highly purified oxide semiconductor film has a much lower off-state current than a transistor including silicon with crystallinity.

Note that in the case where an oxide semiconductor film is used as the semiconductor film, at least indium (In) or zinc (Zn) is preferably included as an oxide semiconductor. In addition, as a stabilizer for reducing variations in electrical characteristics among transistors formed using such an oxide semiconductor, gallium (Ga) is preferably contained in addition to them. Furthermore, tin (Sn) is preferably contained as a stabilizer. Furthermore, hafnium (Hf) is preferably contained as a stabilizer. Furthermore, aluminum (Al) is preferably contained as a stabilizer. Furthermore, zirconium (Zr) is preferably contained as a stabilizer.

Among oxide semiconductors, unlike silicon carbide, gallium nitride, or gallium oxide, an In—Ga—Zn oxide, an In—Sn—Zn oxide, or the like has an advantage of high mass productivity because a transistor with favorable electrical characteristics can be manufactured by a sputtering method or a wet process. Furthermore, unlike silicon carbide, gallium nitride, or gallium oxide, with the use of the In—Ga—Zn oxide, a transistor with favorable electrical characteristics can be manufactured over a glass substrate. Furthermore, a larger substrate can be used.

Furthermore, as another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

For example, as the oxide semiconductor, it is possible to use indium oxide, gallium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide (also referred to as IGZO), an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Pr—Zn oxide, an In—Nd—Zn oxide, an In—Ce—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf—Al—Zn oxide.

Note that for example, an In—Ga—Zn oxide refers to an oxide containing In, Ga, and Zn, and there is no limitation on the ratio of In, Ga, and Zn. Furthermore, a metal element other than In, Ga, and Zn may be contained. The In—Ga—Zn oxide has sufficiently high resistance when no electric field is applied thereto, so that off-state current can be sufficiently reduced. Moreover, the mobility is also high.

For example, high mobility can be obtained relatively easily in the case of using an In—Sn—Zn oxide. Meanwhile, when an In—Ga—Zn oxide is used, the mobility can be increased by reducing the defect density in a bulk.

Furthermore, in the transistor 90, a metal in the source electrode and the drain electrode might extract oxygen from the oxide semiconductor film depending on a conductive material used for the source electrode and the drain electrode. In such a case, oxygen vacancies are formed in regions of the oxide semiconductor film in contact with the source electrode and the drain electrode and hydrogen contained in the oxide semiconductor film enters the oxygen vacancies, so that the regions become n-type regions. The n-type region serves as a source region or a drain region, resulting in a decrease in the contact resistance between the oxide semiconductor film and the source electrode or the drain electrode. Accordingly, the formation of the n-type region increases the mobility and on-state current of the transistor 90, achieving the high-speed operation of a semiconductor device using the transistor 90.

Note that the extraction of oxygen by a metal in the source electrode and the drain electrode is probably caused when the source electrode and the drain electrode are formed by a sputtering method or when heat treatment is performed after the formation of the source electrode and the drain electrode. Furthermore, the n-type region is more likely to be formed by forming the source electrode and the drain electrode with use of a conductive material that is easily bonded to oxygen.

As the conductive material, for example, Al, Cr, Cu, Ta, Ti, Mo, W, and the like can be given.

In the case where the semiconductor film including a stack of a plurality of oxide semiconductor films is used in the transistor 90, the n-type region preferably extends to the oxide semiconductor film 92b serving as a channel region in order that the mobility and on-state current of the transistor 90 can be further increased and the semiconductor device can operate at higher speed.

The insulating film 91 is preferably an insulating film having a function of supplying oxygen to the oxide semiconductor film 92a to the oxide semiconductor film 92c by heating. In addition, it is preferable that the number of defects in the insulating film 91 be small, and typically the spin density at g=2.001 due to a dangling bond of silicon be lower than or equal to $1 \times 10^{18}$ spins/cm$^3$ when obtained by ESR measurement.

The insulating film 91, which has a function of supplying oxygen to the oxide semiconductor film 92a to the oxide semiconductor film 92c by heating, is preferably an oxide, and for example, aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, tantalum oxide, or the like can be used. The insulating film 91 can be formed by a plasma CVD method, a sputtering method, or the like.

Note that in this specification, oxynitride refers to a material that contains oxygen at a higher proportion than nitrogen, and nitride oxide refers to a material that contains nitrogen at a higher proportion than oxygen.

Note that the transistor 90 illustrated in FIG. 11 and FIG. 12 has a structure in which the conductive film 96 overlaps with end portions that do not overlap with the conductive film 93 and the conductive film 94 of end portions of the oxide semiconductor film 92b where a channel region is formed, i.e., end portions that are in a region different from a region where the conductive film 93 and the conductive film 94 are located. When the end portions of the oxide semiconductor film 92b are exposed to plasma by etching for forming the end portions, a chlorine radical, a fluorine radical, or the like generated from an etching gas are easily bonded to a metal element contained in an oxide semiconductor. For this reason, in the end portions of the oxide semiconductor film, oxygen bonded to the metal element is easily released, so that an oxygen vacancy is easily formed; thus, the end portions of the oxide semiconductor film easily have n-type conductivity. However, an electric field applied to the end portions can be controlled by controlling the potential of the conductive film 96 because the end portions of the oxide semiconductor film 92b that do not overlap with the conductive film 93 and the conductive film 94 overlap with the conductive film 96 in the transistor 90 illustrated in FIG. 11 and FIG. 12. Consequently, current that flows between the conductive film 93 and the conductive film 94 through the end portions of the oxide semiconductor film 92b can be controlled by the potential applied to the conductive film 96. Such a structure of the transistor 90 is referred to as a surrounded channel (s-channel) structure.

Specifically, with the s-channel structure, when a potential at which the transistor 90 is turned off is supplied to the conductive film 96, the amount of off-state current that flows between the conductive film 93 and the conductive film 94 through the end portions can be reduced. For this reason, in the transistor 90, even when the distance between the conductive film 93 and the conductive film 94 at the end portions of the oxide semiconductor film 92b is reduced as a result of reducing the channel length to obtain high on-state current, the transistor 90 can have a low off-state current. Consequently, with the short channel length, the transistor 90 can have a high on-state current when in an on state and a low off-state current when in an off state.

Furthermore, specifically, in the case of the s-channel structure, when a potential at which the transistor 90 is turned on is supplied to the conductive film 96, the amount of current that flows between the conductive film 93 and the conductive film 94 through the end portions can be increased. The current contributes to an increase in the field-effect mobility and the on-state current of the transistor 90. Then, when the end portions of the oxide semiconductor film 92b overlap with the conductive film 96, carriers flow in a wide region of the oxide semiconductor film 92b without being limited to a region in the vicinity of the interface of the oxide semiconductor film 92b close to the insulating film 95, which results in an increase in the amount of carrier movement in the transistor 90. As a result, the on-state current of the transistor 90 is increased, and the field-effect mobility is increased, and typically, the field effect mobility becomes greater than or equal to 10 cm$^2$/V·s, further, greater than or equal to 20 cm$^2$/V·s. Note that here, the field-effect mobility is not an approximate value of the mobility as the physical property of the oxide semiconductor film but is the apparent field-effect mobility in a saturation region of the transistor, which is an index of current drive capability.

<Structure of Oxide Semiconductor Film>

A structure of an oxide semiconductor film will be described below. Note that in the following description, the term "parallel" indicates that the angle formed between two straight lines is greater than or equal to −10° and less than or equal to 10°. Accordingly, the case where the angle is greater than or equal to −5° and less than or equal to 5° is also included. Furthermore, the term "perpendicular" indicates that the angle formed between two straight lines is greater than or equal to 80° and less than or equal to 100°. Accordingly, the case where the angle is greater than or equal to 85° and less than or equal to 95° is also included. Furthermore, in this specification, when a crystal is trigonal or rhombohedral, the crystal is represented as the hexagonal crystal system.

An oxide semiconductor film is classified roughly into a non-single-crystal oxide semiconductor film and a single-crystal oxide semiconductor film. The non-single-crystal oxide semiconductor film refers to a CAAC-OS film, a polycrystalline oxide semiconductor film, a microcrystalline oxide semiconductor film, an amorphous oxide semiconductor film, or the like.

[CAAC-OS Film]

First, a CAAC-OS film is described.

The CAAC-OS film is one of oxide semiconductor films having a plurality of c-axis aligned crystal parts.

When a combined analysis image (also referred to as a high-resolution TEM image) of a bright-field image and a diffraction pattern of the CAAC-OS film is observed with a transmission electron microscope (TEM: Transmission Electron Microscope), a plurality of crystal parts can be observed. However, in the high-resolution TEM image, a clear boundary between crystal parts, that is, a crystal boundary (also referred to as a grain boundary) cannot be observed. Thus, in the CAAC-OS film, a reduction in electron mobility due to the grain boundary is less likely to occur.

According to the high-resolution TEM image of a cross section of the CAAC-OS film observed in a direction substantially parallel to the sample surface, metal atoms are arranged in a layered manner in the crystal parts. Each metal atom layer reflects unevenness of a surface over which the film is formed (also referred to as a formation surface) or a top surface of the CAAC-OS film, and is arranged parallel to the formation surface or the top surface of the CAAC-OS film.

On the other hand, when the high-resolution TEM image of a plane of the CAAC-OS film is observed in a direction substantially perpendicular to the sample surface, it can be found that metal atoms are arranged in a triangular or hexagonal arrangement in the crystal parts. However, there is no regularity of arrangement of metal atoms between different crystal parts.

FIG. 15(A) is a high-resolution TEM image of a cross section of a CAAC-OS film. Furthermore, FIG. 15(B) is a high-resolution TEM image of the cross section which is obtained by further enlarging FIG. 15(A), and atomic arrangement is highlighted for easy understanding.

FIG. 15(C) is local Fourier transform images of regions each surrounded by a circle (with a diameter of approximately 4 nm) between A-O-A' in FIG. 15(A). C-axis alignment can be observed in each region in FIG. 15(C). Furthermore, the c-axis direction between A and O is different from that between O and A', which shows different grains. In addition, between A and O, the angle of the c-axis changes gradually and continuously from 14.3°, 16.6°, to 26.4°. Similarly, between O and A', the angle of the c-axis changes gradually and continuously from −18.3°, −17.6°, to −15.9°.

Note that in an electron diffraction pattern of the CAAC-OS film, spots (bright spots) indicating alignment are shown. For example, when electron diffraction with an electron beam having a diameter of 1 nm to 30 nm (such electron diffraction is also referred to as nanobeam electron diffraction) is performed on the top surface of the CAAC-OS film, spots are observed (see FIG. 16(A)).

The high-resolution cross-sectional TEM image and the high-resolution plan-view TEM image show that the crystal parts in the CAAC-OS film have alignment.

Note that most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the high-resolution plan-view TEM image.

When a CAAC-OS film is subjected to structural analysis with an X-ray diffraction (XRD: X-Ray Diffraction) apparatus, for example, in analysis of the CAAC-OS film including an InGaZnO$_4$ crystal by an out-of-plane method, a peak appears at a diffraction angle (2θ) of around 31° in some cases. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface.

On the other hand, when the CAAC-OS film is analyzed by an in-plane method in which an X-ray enters a sample in a direction substantially perpendicular to the c-axis, a peak appears at 2θ of around 56° in some cases. This peak is derived from the (110) plane of the InGaZnO$_4$ crystal. In the case of a single-crystal oxide semiconductor film of InGaZnO$_4$, when analysis (φ scan) is performed under conditions where the sample is rotated around a normal vector of a sample surface as an axis (φ axis) with 2θ fixed at around 56°, six peaks derived from crystal planes equivalent to the (110) plane appear. On the other hand, in the case of a CAAC-OS film, a clear peak is not observed even when φ scan is performed with 2θ fixed at around 56°.

According to the above, in the CAAC-OS film, while the directions of a-axes and b-axes are irregularly oriented between crystal parts, the c-axes are aligned in a direction parallel to a normal vector of a formation surface or a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS film or through crystallization treatment such as heat treatment. As described above, the c-axis of the crystal is aligned in a direction parallel to a normal vector of a formation surface or a top surface of the CAAC-OS film. Thus, for example, when the shape of the CAAC-OS film is changed by etching or the like, the c-axis of the crystal might not be necessarily parallel to a normal vector of a formation surface or a top surface of the CAAC-OS film.

Furthermore, distribution of c-axis aligned crystal parts in the CAAC-OS film is not necessarily uniform. For example, in the case where a crystal part of the CAAC-OS film is formed with crystal growth from the vicinity of the top surface of the CAAC-OS film, the proportion of the c-axis aligned crystal parts of regions in the vicinity of the top surface is higher than that in the vicinity of the formation surface in some cases. Moreover, in the CAAC-OS film to which an impurity is added, a region to which the impurity is added is altered, and a region having a partly different proportion of the c-axis aligned crystal parts is sometimes formed.

Note that when the CAAC-OS film with an InGaZnO$_4$ crystal is analyzed by an out-of-plane method, a peak may also be observed at 2θ of around 36° as well as at 2θ of around 31°. The peak at 2θ of around 36° indicates that a crystal having no c-axis alignment is included in part of the CAAC-OS film. It is preferable that in the CAAC-OS film, a peak appear at 2θ of around 31° and a peak not appear at 2θ of around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

Furthermore, the CAAC-OS film is an oxide semiconductor film having a low density of defect states. For example, in some cases, oxygen vacancies in the oxide semiconductor film serve as carrier traps or serve as carrier generation sources when hydrogen is captured therein.

The state in which the impurity concentration is low and the density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Consequently, a transistor including such an oxide semiconductor film rarely has electrical characteristics with negative threshold voltage (also referred to as normally-on characteristics). Furthermore, the highly purified intrinsic or substantially highly purified intrinsic oxide semiconductor film has few carrier traps. Therefore, the transistor including the oxide semiconductor film becomes a transistor having little variation in electrical characteristics and high reliability. Note that electric charge trapped by the carrier traps in the oxide semiconductor film takes a long time to be released and might behave like fixed electric charge. Thus, the transistor including an oxide semiconductor film having high impurity concentration and a high density of defect states has unstable electrical characteristics in some cases.

Furthermore, in a transistor using the CAAC-OS film, variation in the electrical characteristics of the transistor due to irradiation with visible light or ultraviolet light is small.

[Polycrystalline Oxide Semiconductor Film]

Next, a polycrystalline oxide semiconductor film is described.

In a high-resolution TEM image of the polycrystalline oxide semiconductor film, crystal grains are observed. In most cases, the crystal grain size in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in the high-resolution TEM image, for example. Moreover, in the high-resolution TEM image of the polycrystalline oxide semiconductor film, a grain boundary can be observed in some cases.

The polycrystalline oxide semiconductor film may include a plurality of crystal grains, and alignment of crystals may be different in the plurality of crystal grains. Furthermore, when a polycrystalline oxide semiconductor film is subjected to structural analysis with an XRD apparatus, for example in analysis of the polycrystalline oxide semiconductor film including an $InGaZnO_4$ crystal by an out-of-plane method, a peak appears at $2\theta$ of around 31°, a peak appears at $2\theta$ of around 36°, or another peak appears in some cases.

The polycrystalline oxide semiconductor film has high crystallinity and thus has high electron mobility in some cases. Accordingly, a transistor including the polycrystalline oxide semiconductor film has high field-effect mobility. Note that in the polycrystalline oxide semiconductor film, an impurity is sometimes segregated at a grain boundary. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film is a transistor having larger variation in electrical characteristics and lower reliability than a transistor including a CAAC-OS film in some cases.

[Microcrystalline Oxide Semiconductor Film]

Next, a microcrystalline oxide semiconductor film is described.

In a high-resolution TEM image of a microcrystalline oxide semiconductor film, there are a region where a crystal part is observed and a region where a crystal part is not clearly observed. In most cases, a crystal part in the microcrystalline oxide semiconductor film is greater than or equal to 1 nm and less than or equal to 100 nm or greater than or equal to 1 nm and less than or equal to 10 nm. Specifically, an oxide semiconductor film including nanocrystal (nc: nanocrystal) that is a microcrystal with a size greater than or equal to 1 nm and less than or equal to 10 nm or greater than or equal to 1 nm and less than or equal to 3 nm is referred to as an nc-OS (nanocrystalline Oxide Semiconductor) film. Furthermore, for example, in a high-resolution TEM image of the nc-OS film, a grain boundary cannot be found clearly in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. Furthermore, there is no regularity of crystal orientation between different crystal parts in the nc-OS film. Thus, the orientation of the whole film is not observed. Consequently, in some cases, the nc-OS film cannot be distinguished from an amorphous oxide semiconductor film depending on an analysis method. For example, when the nc-OS film is subjected to structural analysis with an XRD apparatus using an X-ray having a diameter larger than that of a crystal part, in analysis by an out-of-plane method, a peak showing a crystal plane does not appear. Furthermore, a diffraction pattern like a halo pattern appears in an electron diffraction pattern (also referred to as a selected-area electron diffraction pattern) of the nc-OS film obtained by using an electron beam having a probe diameter larger than the diameter of a crystal part (e.g., having a probe diameter of 50 nm or larger). Meanwhile, spots are shown in a nanobeam electron diffraction pattern of the nc-OS film obtained by using an electron beam having a probe diameter close to the diameter of a crystal part or smaller than the diameter of a crystal part. Furthermore, in a nanobeam electron diffraction pattern of the nc-OS film, regions with high luminance in a circular (ring) pattern are sometimes shown. Also in a nanobeam electron diffraction pattern of the nc-OS film, a plurality of spots are sometimes shown in a ring-like region (see FIG. 16(B)).

The nc-OS film is an oxide semiconductor film that has higher regularity than an amorphous oxide semiconductor film. Therefore, the nc-OS film has a lower density of defect states than an amorphous oxide semiconductor film. However, there is no regularity of crystal orientation between different crystal parts in the nc-OS film. Hence, the nc-OS film has a higher density of defect states than the CAAC-OS film.

Consequently, the nc-OS film may have a higher carrier density than the CAAC-OS film. The oxide semiconductor film with a high carrier density has high electron mobility in some cases. Thus, a transistor including the nc-OS film has high field-effect mobility in some cases. Furthermore, the nc-OS film has a higher defect state density than the CAAC-OS film, and thus has a large number of carrier traps in some cases. Consequently, a transistor including the nc-OS film is a transistor having larger variation in electrical characteristics and lower reliability than a transistor including the CAAC-OS film. Note that the nc-OS film can be formed easily as compared to the CAAC-OS film because nc-OS film can be formed even when a relatively large amount of impurities are included; thus, depending on the purpose, it can be favorably used in some cases. Therefore, a semiconductor device using the transistor including the nc-OS film can be manufactured with high productivity in some cases.

[Amorphous Oxide Semiconductor Film]

Next, an amorphous oxide semiconductor film is described.

The amorphous oxide semiconductor film is an oxide semiconductor film having disordered atomic arrangement in the film and no crystal part. An example thereof is an oxide semiconductor film with a non-crystalline state like quartz glass.

In a high-resolution TEM image of the amorphous oxide semiconductor film, crystal parts cannot be found.

When the amorphous oxide semiconductor film is subjected to structural analysis with an XRD apparatus, in analysis by an out-of-plane method, a peak showing a crystal plane does not appear. Furthermore, a halo pattern is shown in electron diffraction of the amorphous oxide semiconductor film. Furthermore, a halo pattern is shown but a spot is not shown in nanobeam electron diffraction of the amorphous oxide semiconductor film.

The amorphous oxide semiconductor film is an oxide semiconductor film that contains impurities such as hydrogen at a high concentration. Furthermore, the amorphous oxide semiconductor film is an oxide semiconductor film having a high density of defect states.

The oxide semiconductor film with a high impurity concentration and a high density of defect states is an oxide semiconductor film having a large number of carrier traps or carrier generation sources.

Accordingly, the amorphous oxide semiconductor film has a much higher carrier density than the nc-OS film in some cases. Therefore, a transistor including the amorphous oxide semiconductor film tends to have normally-on electrical characteristics. Thus, in some cases, it can be used for a transistor that needs normally on electrical characteristics. Since the amorphous oxide semiconductor film has a high density of defect states, carrier traps are increased in some cases. Consequently, a transistor including the amorphous oxide semiconductor film has larger variation in electrical characteristics and lower reliability than a transistor including the CAAC-OS film or the nc-OS film.

[Single-Crystal Oxide Semiconductor Film]

Next, a single-crystal oxide semiconductor film is described.

The single-crystal oxide semiconductor film is an oxide semiconductor film having a low impurity concentration and a low density of defect states (few oxygen vacancies). Thus, the carrier density can be decreased. Accordingly, a transistor including the single-crystal oxide semiconductor film is unlikely to have normally-on electrical characteristics. Moreover, since the single-crystal oxide semiconductor film has a low impurity concentration and a low density of defect states, carrier traps are reduced in some cases. Thus, the transistor including the single-crystal oxide semiconductor film becomes a transistor having small variation in electrical characteristics and having high reliability.

Note that when the oxide semiconductor film has few defects, the density thereof is increased. Furthermore, when the oxide semiconductor film has high crystallinity, the density thereof is increased. Furthermore, when the oxide semiconductor film has a lower concentration of impurities such as hydrogen, the density thereof is increased. The single-crystal oxide semiconductor film has a higher density than the CAAC-OS film. Furthermore, the CAAC-OS film has a higher density than the microcrystalline oxide semiconductor film. Furthermore, the polycrystalline oxide semiconductor film has a higher density than the microcrystalline oxide semiconductor film. Furthermore, the microcrystalline oxide semiconductor film has a higher density than the amorphous oxide semiconductor film.

Note that an oxide semiconductor film has a structure having physical properties intermediate between the nc-OS film and the amorphous oxide semiconductor film in some cases. The oxide semiconductor film having such a structure is specifically referred to as an amorphous-like oxide semiconductor (amorphous-like OS: amorphous-like Oxide Semiconductor) film.

In a high-resolution TEM image of the amorphous-like OS film, a void (also referred to as a void) is seen in some cases. Furthermore, in the high-resolution TEM image, there are a region where a crystal part is clearly observed and a region where a crystal part is not observed. In the amorphous-like OS film, crystallization by a slight amount of electron beam used for TEM observation occurs and growth of the crystal part is found in some cases. In contrast, crystallization by a slight amount of electron beam used for TEM observation is less observed in the nc-OS film having good quality.

Note that the crystal part size in the amorphous-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which 9 layers of 3 In—O layers and 6 Ga—Zn—O layers are layered in the c-axis direction. Accordingly, the spacing between these adjacent layers is equivalent to the lattice spacing (also referred to as d value) on the (009) plane, and the value is calculated to 0.29 nm from crystal structure analysis. Thus, each of the lattice fringes in which the spacing therebetween is greater than or equal to 0.28 nm and less than or equal to 0.30 nm is regarded to correspond to the a-b plane of the $InGaZnO_4$ crystal, focusing on the lattice fringes in the high-resolution TEM image. The maximum length in the region in which the lattice fringes are observed is regarded as the size of crystal part of the amorphous-like OS film and the nc-OS film. Note that the crystal part whose size is 0.8 nm or larger is selectively evaluated.

Figure 17:
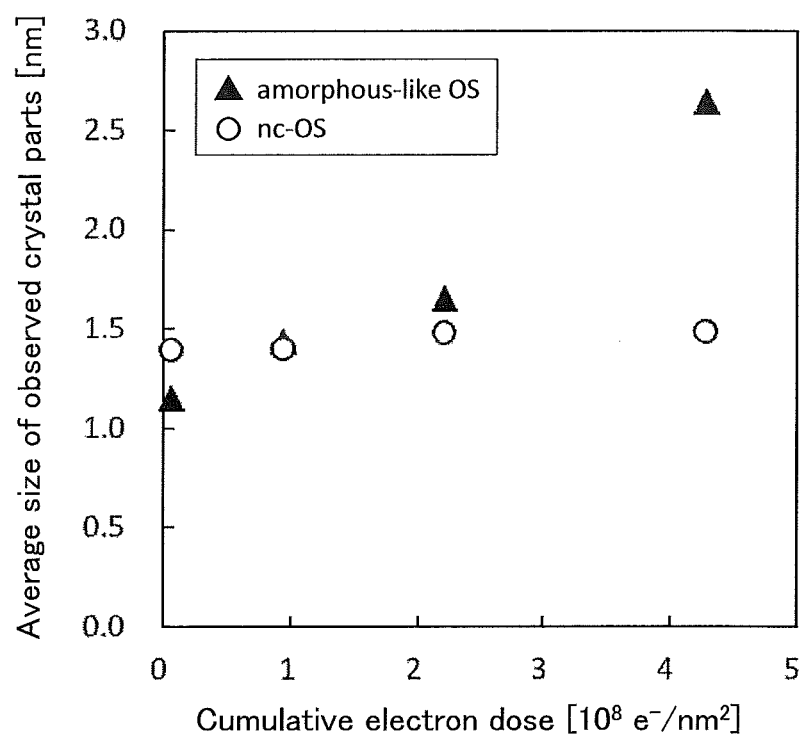
FIG. 17 shows a diagram illustrating an example of a structure of an oxide semiconductor.

FIG. 17 shows examination examples of change in average size of crystal parts (20 points to 40 points) in the amorphous-like OS film and the nc-OS film using high-resolution TEM images. From FIG. 17, the crystal part size in the amorphous-like OS film increases with an increase in the cumulative electron dose. Specifically, the crystal part of approximately 1.2 nm at the start of TEM observation grows to a size of approximately 2.6 nm at the total amount of electron irradiation of $4.2 \times 10^8$ $e^-/nm^2$. In contrast, the crystal part size in the good-quality nc-OS film shows little change from the start of electron irradiation to the total amount of electron irradiation of $4.2 \times 10^8$ $e^-/nm^2$ regardless of the amount of electron irradiation.

Furthermore, in FIG. 17, by linear approximation of the change in the crystal part size in the amorphous-like OS film and the nc-OS film and extrapolation to the total amount of electron irradiation of 0 $e^-/nm^2$, the average size of the crystal part is found to be a positive value. This means that the crystal parts exist in the amorphous-like OS film and the nc-OS film before TEM observation.

Note that an oxide semiconductor film may be a stacked film including two or more kinds of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 16A:
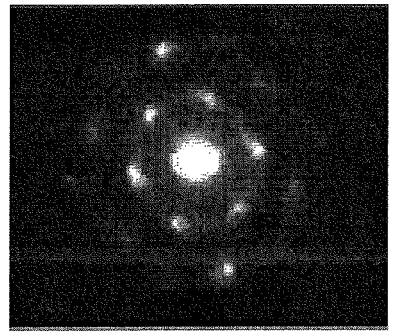
FIGS. 16A-16D show diagrams illustrating an example of a structure of an oxide semiconductor.
Figure 16B:
Figure 16C:
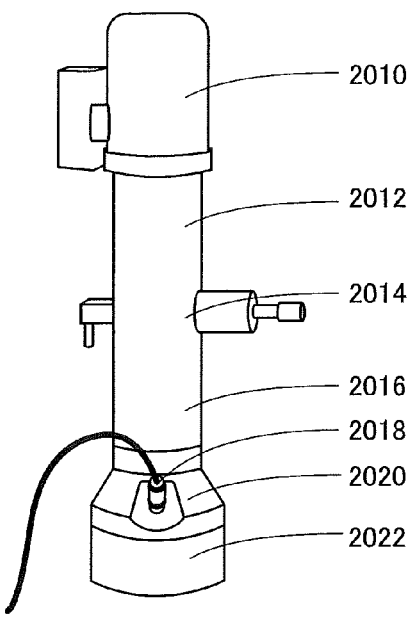

FIG. 16(C) illustrates a transmission electron diffraction measurement apparatus that includes an electron gun chamber 2010, an optical system 2012 below the electron gun chamber 2010, a sample chamber 2014 below the optical system 2012, an optical system 2016 below the sample chamber 2014, an observation chamber 2020 below the optical system 2016, a camera 2018 installed in the observation chamber 2020, and a film chamber 2022 below the observation chamber 2020. The camera 2018 is provided to face toward the inside of the observation chamber 2020. Note that the film chamber 2022 is not necessarily provided.

Figure 16D:
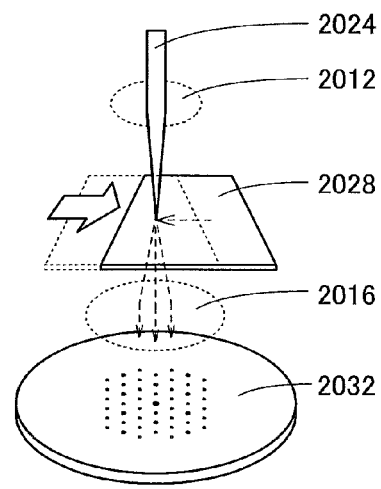

Furthermore, FIG. 16(D) illustrates the internal structure of the transmission electron diffraction measurement apparatus in FIG. 16(C). In the transmission electron diffraction measurement apparatus, a substance 2028 that is positioned in the sample chamber 2014 is irradiated with electrons emitted from an electron gun installed in the electron gun chamber 2010 through the optical system 2012. Electrons passing through the substance 2028 are incident on a fluorescent plate 2032 provided in the observation chamber 2020 through the optical system 2016. On the fluorescent plate 2032, a pattern corresponding to the intensity of the incident electrons appears, which allows measurement of a transmission electron diffraction pattern.

The camera 2018 is installed so as to face the fluorescent plate 2032 and can take an image of a pattern appearing on the fluorescent plate 2032. An angle formed by a straight line that passes through the center of a lens of the camera 2018 and the center of the fluorescent plate 2032 and an upper surface of the fluorescent plate 2032 is, for example, greater than or equal to 15° and less than or equal to 80°, greater than or equal to 30° and less than or equal to 75°, or greater than or equal to 45° and less than or equal to 70°. As the angle becomes smaller, distortion of the transmission electron diffraction pattern taken by the camera 2018 becomes larger. Note that if the angle is obtained in advance, the distortion of an obtained transmission electron diffraction pattern can be corrected. Note that the film chamber 2022 is provided with the camera 2018 in some cases. For example, the camera 2018 may be set in the film chamber 2022 so as to be opposite to the incident direction of electrons 2024. In this case, a transmission electron diffraction pattern with less distortion can be taken from the rear surface of the fluorescent plate 2032.

A holder for fixing the substance 2028 that is a sample is provided in the sample chamber 2014. The holder has a structure to transmit electrons passing through the substance 2028. The holder may have, for example, a function of moving the substance 2028 in the direction of the X, Y, and Z axes. The movement function of the holder may have an accuracy of moving the substance in the range of, for example, greater than or equal to 1 nm and less than or equal to 10 nm, greater than or equal to 5 nm and less than or equal to 50 nm, greater than or equal to 10 nm and less than or equal to 100 nm, greater than or equal to 50 nm and less than or equal to 500 nm, and greater than or equal to 100 nm and less than or equal to 1 μm. The range is preferably determined to be an optimal range for the structure of the substance 2028.

Then, a method for measuring a transmission electron diffraction pattern of a substance by the transmission electron diffraction measurement apparatus described above will be described.

For example, changes in the structure of a substance can be observed by changing (scanning) the irradiation position of the electrons 2024 that are a nanobeam on the substance as illustrated in FIG. 16(D). At this time, when the substance 2028 is a CAAC-OS film, a diffraction pattern such as one shown in FIG. 16(A) is observed. Further, when the substance 2028 is an nc-OS film, a diffraction pattern such as one shown in FIG. 16(B) is observed.

By the way, even when the substance 2028 is a CAAC-OS film, a diffraction pattern similar to that of an nc-OS film or the like is partly observed in some cases. Therefore, the quality of a CAAC-OS film can be sometimes represented by the proportion of a region where a diffraction pattern of a CAAC-OS film is observed in a predetermined area (also referred to as proportion of CAAC). For example, in a high-quality CAAC-OS film, the proportion of CAAC is 50% or higher, preferably 80% or higher, further preferably 90% or higher, still further preferably 95% or higher. Note that the proportion of a region where a diffraction pattern different from that of a CAAC-OS film is observed is referred to as the proportion of non-CAAC.

For example, transmission electron diffraction patterns were obtained by scanning top surfaces of samples each including a CAAC-OS film obtained just after deposition (represented as "as-sputtered") or subjected to heat treatment at 450° C. in an atmosphere containing oxygen. Here, the proportion of CAAC was obtained in such a manner that diffraction patterns were observed by scanning for 60 seconds at a rate of 5 nm/s and the obtained diffraction patterns were converted into still images every 0.5 seconds. Note that as an electron beam, a nanobeam electron beam with a probe diameter of 1 nm was used. Note that the similar measurement was performed on six samples. Then, the proportion of CAAC was calculated using the average value of the six samples.

Figure 18A:
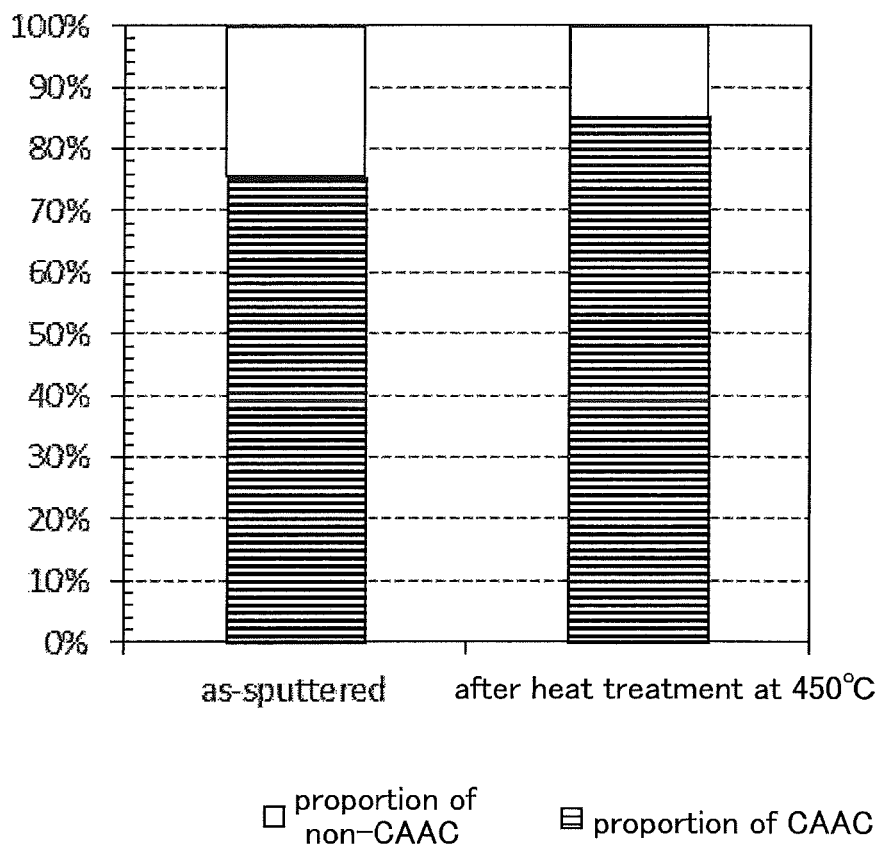
FIGS. 18A-18C show diagrams illustrating an example of a structure of an oxide semiconductor.

FIG. 18(A) shows the proportion of CAAC in each sample. The proportion of CAAC of the as-sputtered CAAC-OS film was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., 400° C. or higher) reduces the proportion of non-CAAC (increases the proportion of CAAC). The above results also indicate that the CAAC-OS film having a high proportion of CAAC can be obtained even in the heat treatment at lower than 500° C.

Here, most of diffraction patterns different from that of a CAAC-OS film were similar to diffraction patterns of an nc-OS film. Furthermore, an amorphous oxide semiconductor film was not observed in the measurement region. Therefore, the above results suggest that the region having a structure similar to that of an nc-OS film is rearranged by heat treatment owing to the influence of the structure of the adjacent region, whereby the region becomes CAAC.

Figure 18B:
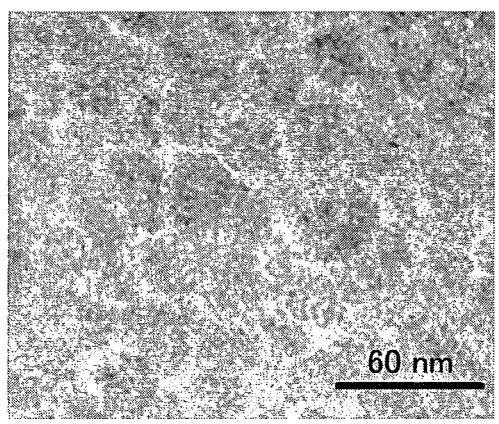
Figure 18C:
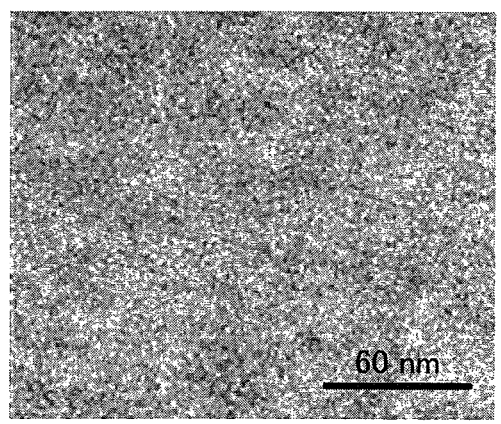

FIG. 18(B) and FIG. 18(C) are high-resolution plan-view TEM images of the as-sputtered CAAC-OS film and the CAAC-OS film subjected to the heat treatment at 450° C., respectively. Comparison between FIG. 18(B) and FIG. 18(C) shows that the CAAC-OS film subjected to the heat treatment at 450° C. has more uniform film quality. That is, it is found that heat treatment at a high temperature improves the film quality of the CAAC-OS film.

With such a measurement method, the structure of an oxide semiconductor film having a plurality of structures can be analyzed in some cases.

This embodiment can be implemented in appropriate combination with any of the other embodiments.

Embodiment 5

In this embodiment, an example of a structure of a semiconductor device having the structure different from that in FIG. 10 is described.

Figure 13:
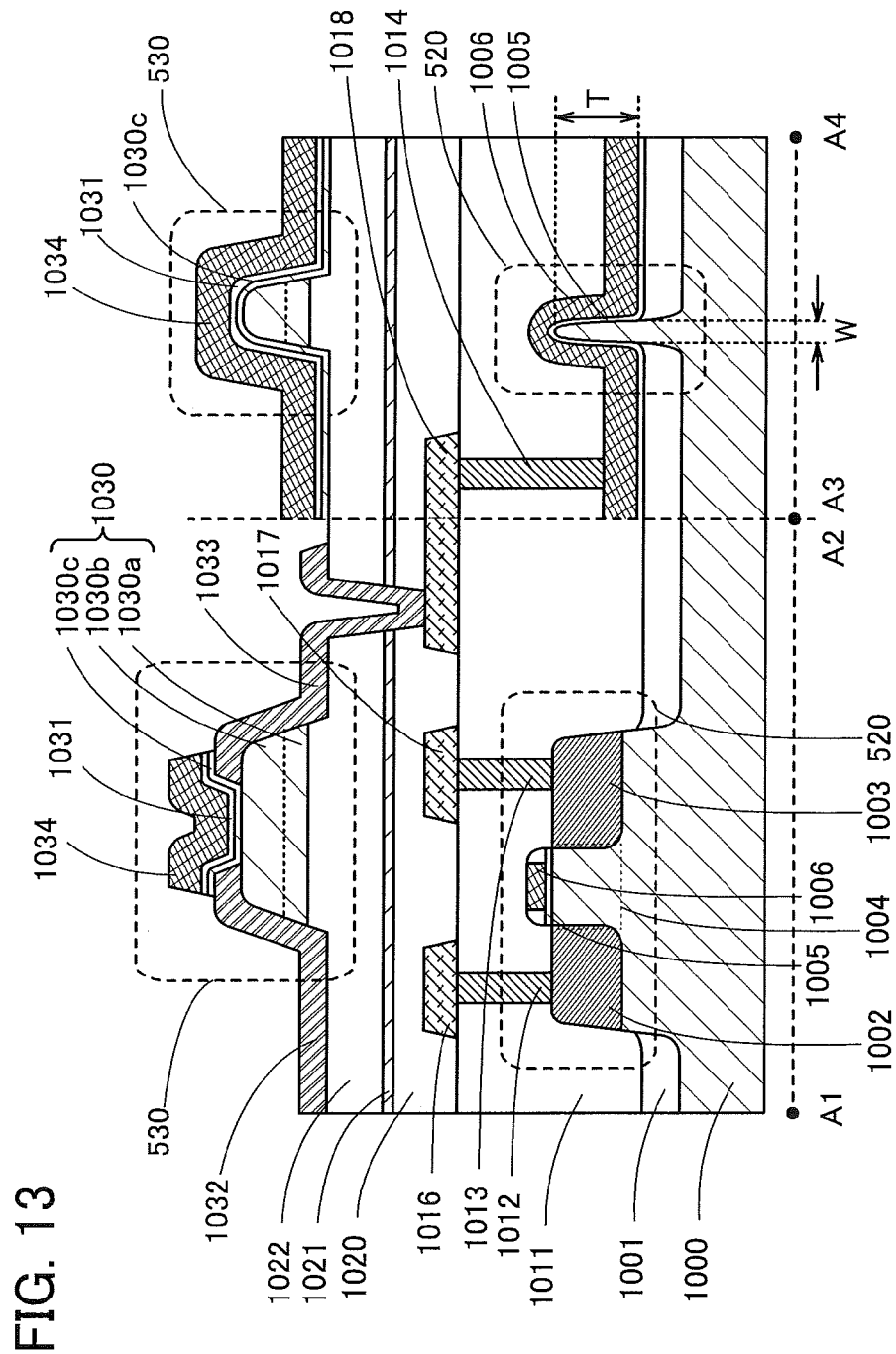
FIG. 13 shows a diagram illustrating an example of a structure of a transistor.

FIG. 13 shows an example of a cross-sectional structure of a semiconductor device. Note that a region along dashed line A1-A2 shows a structure of the transistors 520 and 530 in the channel length direction, and a region along dashed line A3-A4 shows a structure of the transistors 520 and 530 in the channel width direction. Note that in one embodiment of the present invention, the channel length direction of the transistor 520 is not necessarily the same as the channel length direction of the transistor 530.

Note that the channel length direction refers to a direction in which a carrier moves between a source (a source region or a source electrode) and a drain (a drain region or a drain electrode), and the channel width direction refers to a direction perpendicular to the channel length direction in a plane parallel to a substrate.

Note that FIG. 13 illustrates the case where the transistor 530 that is an OS transistor is formed over the transistor 520 that is a Si transistor. Note that such a structure in which a Si transistor and an OS transistor are stacked can be appropriately used for the circuit 30. Note that in this embodiment, the gate of the transistor 520 is connected to the one of the source and the drain of the transistor 530 as in FIG. 9(B), however, there is no limitation thereto. One of the source and the drain of the transistor 520 may be connected to the gate of the transistor 530 (see FIG. 8(D)), one of the source and the drain of the transistor 520 may be connected to one of the source and the drain of the transistor 530 (see FIG. 9(A)), or the gate of the transistor 520 may be connected to the gate of the transistor 530 (see FIG. 9(C)).

The transistor 520 may include the channel formation region in a semiconductor film or a semiconductor substrate of silicon, germanium, or the like in an amorphous, microcrystalline, polycrystalline, or single crystal state. Alternatively, the transistor 520 may include the channel formation region in an oxide semiconductor film or an oxide semiconductor substrate. In the case where the transistors each include a channel formation region in an oxide semiconductor film or an oxide semiconductor substrate, the transistor 530 is not necessarily stacked over the transistor 520, and the transistor 530 and the transistor 520 may be formed in the same layer.

In the case where the transistor 520 is formed using a thin silicon film, any of the following can be used in the thin film: amorphous silicon formed by a vapor phase growth method such as a plasma CVD method or a sputtering method; polycrystalline silicon obtained by crystallization of amorphous silicon by treatment such as laser irradiation; single crystal silicon obtained by separation of a surface portion by implantation of hydrogen ions or the like into a single crystal silicon wafer; and the like.

A substrate 1000 where the transistor 520 is formed can be, for example, a silicon substrate, a germanium substrate, or a silicon germanium substrate. FIG. 13 illustrates an example where a single crystal silicon substrate is used as the substrate 1000.

Furthermore, the transistor 520 is electrically isolated by an element isolation method. As the element isolation method, a trench isolation method or the like can be used. FIG. 13 illustrates an example where the trench isolation method is used to electrically isolate the transistor 520. Specifically, FIG. 13 illustrates an example where an element isolation region 1001 is formed in such a manner that an insulator including silicon oxide or the like is buried in a trench formed in the substrate 1000 by etching or the like and then the insulator is removed partly by etching or the like, so that the transistor 520 is electrically isolated by element isolation.

Furthermore, in a projection of the substrate 1000 that exists in a region other than the trench, an impurity region 1002 and an impurity region 1003 of the transistor 520 and a channel formation region 1004 placed between the impurity region 1002 and the impurity region 1003 are provided. Furthermore, the transistor 520 includes an insulating film 1005 covering the channel formation region 1004 and a gate electrode 1006 that overlaps with the channel formation region 1004 with the insulating film 1005 provided therebetween.

In the transistor 520, a side portion and an upper portion of the projection in the channel formation region 1004 overlap with the gate electrode 1006 with the insulating film 1005 positioned therebetween, so that carriers flow in a wide area including the side portion and the upper portion of the channel formation region 1004. Therefore, an area over the substrate occupied by the transistor 520 can be reduced, and the number of transferred carriers in the transistor 520 can be increased. As a result, the on-state current and field-effect mobility of the transistor 520 are increased. Suppose the length in the channel width direction (channel width) of the projection in the channel formation region 1004 is W, and the thickness of the projection in the channel formation region 1004 is T. As the aspect ratio of the thickness T to the channel width W increases, a region where carriers flow becomes larger; thus, the on-state current of the transistor 520 can be further increased and the field-effect mobility can be further increased.

Note that when the transistor 520 is formed using a bulk semiconductor substrate, the aspect ratio is preferably 0.5 or more, further preferably 1 or more.

An insulating film 1011 is provided over the transistor 520. Openings are formed in the insulating film 1011. Furthermore, a conductive film 1012 and a conductive film 1013 that are electrically connected to the impurity region 1002 and the impurity region 1003, respectively, and a conductive film 1014 that is electrically connected to the gate electrode 1006 are formed in the openings.

Furthermore, the conductive film 1012 is electrically connected to a conductive film 1016 formed over the insulating film 1011, the conductive film 1013 is electrically connected to a conductive film 1017 formed over the insulating film 1011, and the conductive film 1014 is electrically connected to a conductive film 1018 formed over the insulating film 1011.

An insulating film 1020 is provided over the conductive film 1016 to the conductive film 1018. An insulating film 1021 having a blocking effect of preventing diffusion of oxygen, hydrogen, and water is provided over the insulating film 1020. As the insulating film 1021 has higher density and becomes denser or has a fewer dangling bonds and becomes more chemically stable, the blocking effect is higher. The insulating film 1021 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 1021 having an effect of blocking diffusion of hydrogen and water can be formed using, for example, silicon nitride, silicon nitride oxide, or the like.

An insulating film 1022 is provided over the insulating film 1021, and the transistor 530 is provided over the insulating film 1022.

The transistor 530 includes, over the insulating film 1022, a semiconductor film 1030 including an oxide semiconductor, a conductive film 1032 and a conductive film 1033 functioning as source and drain electrodes and electrically connected to the semiconductor film 1030, a gate insulating film 1031 covering the semiconductor film 1030, and a gate electrode 1034 overlapping with the semiconductor film 1030 with the gate insulating film 1031 positioned therebetween. Note that an opening is formed in the insulating film 1020 to the insulating film 1022, and the conductive film 1033 is connected to the conductive film 1018 in the opening.

Note that in FIG. 13, the transistor 530 includes at least the gate electrode 1034 on one side of the semiconductor film 1030, and may further include a gate electrode overlapping with the semiconductor film 1030 with the insulating film 1022 positioned therebetween.

In the case where the transistor 530 has a pair of gate electrodes, one of the gate electrodes may be supplied with a signal for controlling the on/off state, and the other of the gate electrodes may be supplied with another signal. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

Furthermore, FIG. 13 illustrates an example where the transistor 530 has a single-gate structure where one channel formation region corresponding to one gate electrode 1034 is provided. However, the transistor 530 may have a multi-gate structure where a plurality of electrically connected gate electrodes are provided so that a plurality of channel formation regions are included in one active layer.

Furthermore, FIG. 13 illustrates an example in which the semiconductor film 1030 included in the transistor 530 includes an oxide semiconductor film 1030a to an oxide semiconductor film 1030c that are stacked in this order over the insulating film 1022. Note that in one embodiment of the present invention, the semiconductor film 1030 of the transistor 530 may be formed using a single-layer metal oxide film.

Note that this embodiment can be implemented in appropriate combination with any of the other embodiments.

Embodiment 6

The variety of films disclosed in the other embodiments, such as the conductive films, the semiconductor films, and the insulating films can be formed by a sputtering method or a plasma CVD method; however, such films may be formed by another method, e.g., a thermal CVD method. An MOCVD (Metal Organic Chemical Vapor Deposition method or an ALD (Atomic Layer Deposition) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in the chamber is set to an atmospheric pressure or a reduced pressure, and reaction is caused in the vicinity of the substrate or over the substrate to be deposited over the substrate.

Furthermore, deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, an inert gas (e.g., argon or nitrogen) or the like is introduced when or after a first source gas is introduced so that the source gases are not mixed, and then a second source gas is introduced. Note that in the case where the inert gas is introduced at the same time as the first source gas, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is controlled and repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive film, the semiconductor film, and the insulating film which have been disclosed in the above-described embodiments can be formed by a thermal CVD method such as an MOCVD method or an ALD method, and for example, in the case where an In—Ga—Zn—O film is formed, trimethylindium, trimethylgallium, and dimethylzinc can be used. Note that the chemical formula of trimethylindium is $In(CH_3)_3$. Furthermore, the chemical formula of trimethylgallium is $Ga(CH_3)_3$. Furthermore, the chemical formula of dimethylzinc is $Zn(CH_3)_2$. Furthermore, without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed with a deposition apparatus employing ALD, 2 kinds of gases, i.e., ozone ($O_3$) as an oxidizer and a source gas which is obtained by vaporizing liquid containing a solvent and a hafnium precursor compound (hafnium alkoxide or hafnium amide such as tetrakis(dimethylamide)hafnium (TDMAH)) are used. Note that the chemical formula of tetrakis(dimethylamide)hafnium is $Hf[N(CH_3)_2]_4$. Furthermore, examples of another material liquid include tetrakis (ethylmethylamide)hafnium.

For example, in the case where an aluminum oxide film is formed using a deposition apparatus employing ALD, two kinds of gases, e.g., a source gas which is obtained by vaporizing liquid containing a solvent and an aluminum precursor compound (e.g., trimethylaluminum (TMA)) and $H_2O$ as an oxidizer are used. Note that the chemical formula of trimethylaluminum is $Al(CH_3)_3$. Furthermore, examples of another material liquid include tris(dimethylamide)aluminum, triisobutylaluminum, and aluminum tris(2,2,6,6-tetramethyl-3,5-heptanedionate).

For example, in the case where a silicon oxide film is formed with a deposition apparatus employing ALD, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a Ga—O layer, and then a $Zn(CH_3)_2$ gas and an $O_3$ gas are introduced at a time to form a Zn—O layer. Note that the order of these layers is not limited to this example. Furthermore, a mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

Note that this embodiment can be implemented in appropriate combination with any of the other embodiments.

Embodiment 7

The semiconductor device of one embodiment of the present invention can be used for display devices, personal computers, or image reproducing devices provided with recording media (typically, devices which reproduce the content of recording media such as DVD:Digital Versatile Disc and have displays for displaying the reproduced images). Other examples of electronic devices that can be equipped with the semiconductor device of one embodiment of the present invention are cellular phones, game machines including portable game machines, portable information terminals, e-book readers, cameras such as video cameras and digital still cameras, goggle-type displays (head mounted displays), navigation systems, audio reproducing devices (e.g., car audio systems, digital audio players, and the like), copiers, facsimiles, printers, multifunction printers, automated teller machines (ATM), vending machines, medical devices, and the like. FIG. 14 illustrates specific examples of these electronic devices.

Figure 14A:
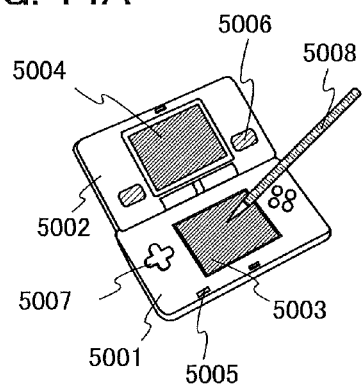
FIGS. 14A-14F show diagrams illustrating electronic devices.

FIG. 14(A) illustrates a portable game machine, which includes a housing 5001, a housing 5002, a display portion 5003, a display portion 5004, a microphone 5005, a speaker 5006, an operation key 5007, a stylus 5008, and the like. The semiconductor device of one embodiment of the present invention can be used for a variety of integrated circuits included in portable game machines. Note that although the portable game machine in FIG. 14(A) has the two display portion 5003 and display portion 5004, the number of display portions included in a portable game machine is not limited to this.

Figure 14B:
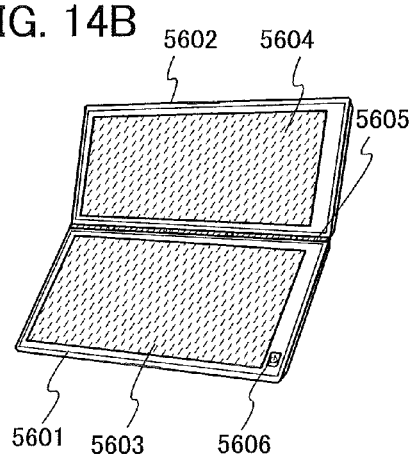

FIG. 14(B) illustrates a portable information terminal including a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. Furthermore, the first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. Furthermore, a display device with a function as a position input device may be used as at least one of the first display portion 5603 and the second display portion 5604. Note that the function as the position input device can be added by providing a touch panel in a display device. Alternatively, the function as the position input device can be added by provision of a photoelectric conversion element called a photosensor in a pixel portion of a display device.

Figure 14C:
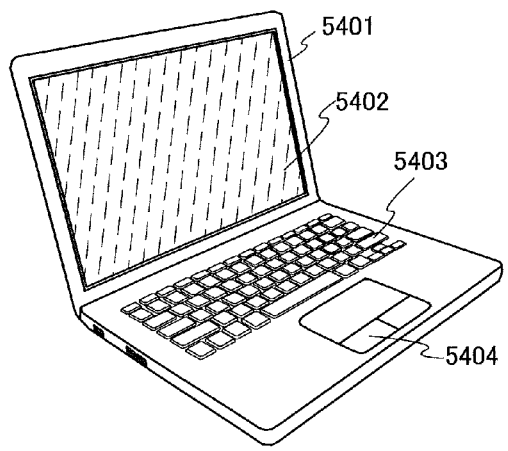

FIG. 14(C) illustrates a notebook type personal computer including a housing 5401, a display portion 5402, a keyboard 5403, a pointing device 5404, and the like. The semiconductor device of one embodiment of the present invention can be used for a variety of integrated circuits included in notebook type personal computers.

Figure 14D:
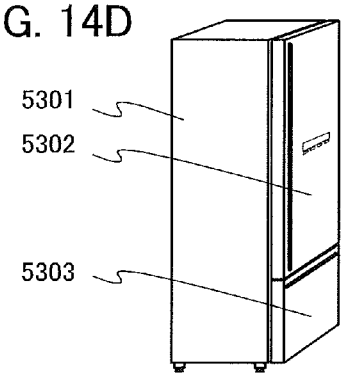

FIG. 14(D) illustrates an electric refrigerator-freezer including a housing 5301, a refrigerator door 5302, a freezer door 5303, and the like. The semiconductor device of one embodiment of the present invention can be used for a variety of integrated circuits included in electric refrigerator-freezers.

Figure 14E:
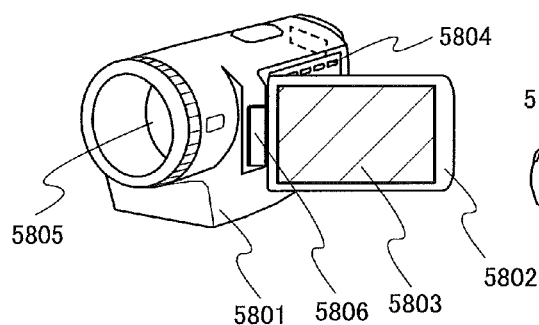

FIG. 14(E) illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. Furthermore, the first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 14F:
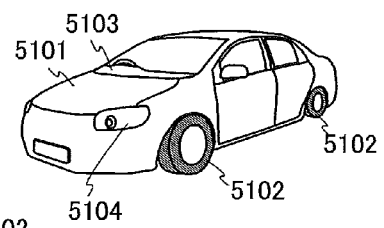

FIG. 14(F) illustrates an ordinary vehicle including a car body 5101, wheels 5102, a dashboard 5103, lights 5104, and the like. The semiconductor device of one embodiment of the present invention can be used for a variety of integrated circuits included in ordinary vehicles.

(Description of the Specification and the Like)

Description of this specification and the like will be described below.

In this specification and the like, the case where "X and Y are connected" is explicitly described includes the case where X and Y are electrically connected, the case where X and Y are functionally connected, and the case where X and Y are directly connected. Accordingly, without being limited to a predetermined connection relation, for example, a connection relation shown in drawings or text, another connection relation is included in the drawings or the text.

Here, X and Y each denote an object (e.g., a device, an element, a circuit, a wiring, an electrode, a terminal, a conductive film, a layer, or the like).

As an example of the case where X and Y are electrically connected, one or more elements that enable an electrical connection between X and Y (e.g., a switch, a transistor, a capacitor, an inductor, a resistor, a diode, a display element, a light-emitting element, a load, or the like) can be connected between X and Y. Note that the switch has a function of being controlled to be on or off. That is, the switch has a function of being conducting (in an on state) or not conducting (in an off state) to determine whether current flows therethrough or not. Alternatively, the switch has a function of selecting and changing a current path.

For example, in the case where X and Y are functionally connected, one or more circuits that enable functional connection between X and Y (e.g., a logic circuit (an inverter, a NAND circuit, or a NOR circuit); a signal converter circuit (a D/A converter circuit, an A/D converter circuit, or a gamma correction circuit); a potential level converter circuit (a power supply circuit (e.g., a step-up circuit or a step-down circuit) or a level shifter circuit for changing the potential level of a signal); a voltage source; a current source; a switching circuit; an amplifier circuit (a circuit that can increase signal amplitude, the amount of current, or the like, an operational amplifier, a differential amplifier circuit, a source follower circuit, a buffer circuit, and the like); a signal generation circuit; a memory circuit; a control circuit; or the like) can be connected between X and Y. Note that for example, even when another circuit is interposed between X and Y, X and Y are functionally connected if a signal output from X is transmitted to Y.

Note that the case where "X and Y are electrically connected" is explicitly described includes the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween). That is, the case where "X and Y are electrically connected" is explicitly described is the same as the case where "X and Y are connected" is explicitly only described.

Furthermore, a source of a transistor means a source region that is part of a semiconductor film functioning as an active layer or a source electrode connected to the semiconductor film. Similarly, a drain of a transistor means a drain region that is part of the semiconductor film or a drain electrode connected to the semiconductor film. Furthermore, a gate means a gate electrode.

The names of a source and a drain of a transistor interchange with each other depending on the conductivity type of the transistor or the levels of potentials applied to the terminals. In general, in an n-channel transistor, a terminal to which a lower potential is applied is referred to as a source, and a terminal to which a higher potential is applied is referred to as a drain. Furthermore, in a p-channel transistor, a terminal to which a lower potential is applied is referred to as a drain, and a terminal to which a higher potential is applied is referred to as a source. In this specification, the connection relation of the transistor is sometimes described assuming that the source and the drain are fixed for convenience; actually, the names of the source and the drain interchange with each other depending on the relation of the potentials.

Note that even when independent components are electrically connected to each other in a circuit diagram, one component has functions of a plurality of components in some cases. For example, when part of a wiring also functions as an electrode, one conductive film has functions of both of the components, a function as the wiring and a function as the electrode. Thus, "electrical connection" in this specification includes in its category such a case where one conductive film has functions of a plurality of components.

REFERENCE NUMERALS 10 semiconductor device
20 circuit
30 circuit
31 circuit
32 circuit
33 circuit
40 cache memory
41 circuit
42 circuit
50 main memory device
51 circuit
52 circuit
60 auxiliary memory device
61 circuit
62 circuit
90 transistor
91 insulating film
92a oxide semiconductor film
92b oxide semiconductor film
92c oxide semiconductor film
93 conductive film
94 conductive film
95 insulating film
96 conductive film
97 substrate
100 substrate
101 insulating layer
102 conductive layer
103 insulating layer
111 circuit
112 circuit
113 circuit
114 cell array
120 memory circuit
130 logic circuit
131 circuit
140 logic circuit
201 wiring
202 wiring
203 wiring
301 transistor
302 transistor
303 circuit
304 inverter
305 inverter
311 transistor
312 transistor
313 circuit
314 inverter
315 inverter
321 transistor
322 transistor
323 transistor
324 resistor 331 transistor
332 transistor
333 transistor
334 transistor
341 transistor
342 capacitor
411 transistor
412 transistor
413 resistor
421 transistor
422 transistor
423 transistor
424 resistor
425 resistor
431 transistor
432 transistor
433 transistor
434 resistor
435 resistor
500 semiconductor substrate
501 insulator
502 well
503 gate insulating film
504 gate electrode
505 impurity region
506 interlayer insulating layer
507 oxide semiconductor layer
508 wiring
509 gate insulating film
510 gate electrode
511 interlayer insulating layer
512 wiring
520 transistor
530 transistor
801 semiconductor substrate
810 element isolation region
811 insulating film
812 insulating film
813 insulating film
825 conductive film
826 conductive film
827 conductive film
834 conductive film
835 conductive film
836 conductive film
837 conductive film
844 conductive film
851 conductive film
852 conductive film
853 conductive film
861 insulating film
901 semiconductor film
910 region
911 region
921 conductive film
922 conductive film
931 gate electrode
962 gate insulating film
963 insulating film
1000 substrate
1001 element isolation region
1002 impurity region
1003 impurity region
1004 channel formation region
1005 insulating film
1006 gate electrode
1011 insulating film
1012 conductive film
1013 conductive film
1014 conductive film
1016 conductive film
1017 conductive film
1018 conductive film
1020 insulating film
1021 insulating film
1022 insulating film
1030 semiconductor film
1030a oxide semiconductor film
1030b oxide semiconductor film
1030c oxide semiconductor film
1031 gate insulating film
1032 conductive film
1033 conductive film
1034 gate electrode
2010 electron gun chamber
2012 optical system
2014 sample chamber
2016 optical system
2018 camera
2020 observation chamber
2022 film chamber
2024 electron
2028 substance
2032 fluorescent plate
5001 housing
5002 housing
5003 display portion
5004 display portion
5005 microphone
5006 speaker
5007 operation key
5008 stylus
5101 car body
5102 wheel
5103 dashboard
5104 lights
5301 housing
5302 refrigerator door
5303 freezer door
5401 housing
5402 display portion
5403 keyboard
5404 pointing device
5601 housing
5602 housing
5603 display portion
5604 display portion
5605 joint
5606 operation key
5801 housing
5802 housing
5803 display portion
5804 operation key
5805 lens
5806 joint This application is based on Japanese Patent Application serial no. 2014-051215 filed with Japan Patent Office on Mar. 14, 2014, the entire contents of which are hereby incorporated by reference.

What is claimed is:
1. A semiconductor device comprising a cell array, wherein the cell array includes a first circuit and a second circuit, wherein both of the first circuit and the second circuit are formed on a same plane, wherein a third circuit is provided over the first circuit and the second circuit with an insulating layer therebetween, wherein the first circuit includes a first memory circuit, wherein the second circuit includes a second memory circuit, wherein the third circuit includes a logic circuit, wherein the first memory circuit is electrically connected to a first line, wherein the second memory circuit is electrically connected to the first line, wherein the logic circuit is electrically connected to the first memory circuit through a second line, wherein the logic circuit is electrically connected to the second memory circuit through a third line, wherein the logic circuit has a function of performing logic operation using data stored in at least one of the first memory circuit and the second memory circuit as an input signal, wherein an output of the logic circuit is electrically connected to the first line, wherein the second line and the third line are different from the first line, and wherein the third circuit includes a region overlapping with the first circuit.

2. The semiconductor device according to claim 1 has a function of outputting data stored in the first memory circuit and a result of the logic operation to a central processing unit.

3. The semiconductor device according to claim 1, wherein the first memory circuit includes a first transistor, wherein the logic circuit includes a second transistor, wherein the first transistor includes a single crystal semiconductor in a channel formation region, and wherein the second transistor includes an oxide semiconductor in a channel formation region.

4. The semiconductor device according to claim 3, wherein one of a source and a drain of the first transistor is electrically connected to a gate of the second transistor.

5. The semiconductor device according to claim 1, wherein the first memory circuit includes an SRAM cell, and wherein the logic circuit includes an AND circuit, an OR circuit, a NAND circuit, a NOR circuit, or a circuit of any of them.

6. The semiconductor device according to claim 1, wherein the second circuit is adjacent to the first circuit.

7. The semiconductor device according to claim 1, wherein the first circuit and the second circuit are directly connected to the first line, and wherein the third circuit is directly connected to the first line.

* * * * *